(12) United States Patent
Tamada et al.

(10) Patent No.: US 6,744,670 B2
(45) Date of Patent: Jun. 1, 2004

(54) NON-VOLATILE SEMICONDUCTOR MEMORY DEVICE

(75) Inventors: Satoru Tamada, Hyogo (JP); Tatsuya Saeki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/315,034

(22) Filed: Dec. 10, 2002

(65) Prior Publication Data

US 2003/0151950 A1 Aug. 14, 2003

(30) Foreign Application Priority Data

Feb. 14, 2002 (JP) ........................................ 2002-037339

(51) Int. Cl.$^7$ .............................................. G11C 16/04
(52) U.S. Cl. ............................ 365/185.19; 365/185.18; 365/185.29
(58) Field of Search ........................ 365/185.19, 185.18, 365/185.29, 185.22, 185.24

(56) References Cited

U.S. PATENT DOCUMENTS 5,991,200 A * 11/1999 Seki et al. ............. 365/185.18

FOREIGN PATENT DOCUMENTS

| JP | 63-244499 | 10/1988 |
|---|---|---|
| JP | 02-239497 | 9/1990 |
| JP | P2000-90686 A | 3/2000 |
| JP | P2001-210082 A | 8/2001 |

* cited by examiner

Primary Examiner—David Lam
(74) Attorney, Agent, or Firm—McDermott, Will & Emery

(57) ABSTRACT

The number of times of rewriting of memory cells is stored by number of rewrite (EW) times storage section. In data rewriting to memory cells, number of rewriting times data of a selected memory cell is transferred to and latched in a number of EW times sense latch section and transferred to a number of EW times counter. Controlling processor (CPU) sets a condition on a write pulse on the basis of a value obtained by updating a count value of the number of EW times counter and controls the operation of rewriting. In data rewriting, a count value after update of the number of EW times counter is transferred to the number of EW times sense latch section. The updated number of rewritings is transferred to a corresponding number of EW times storage section, in parallel to data rewriting to a memory cell.

17 Claims, 23 Drawing Sheets

FIG. 1
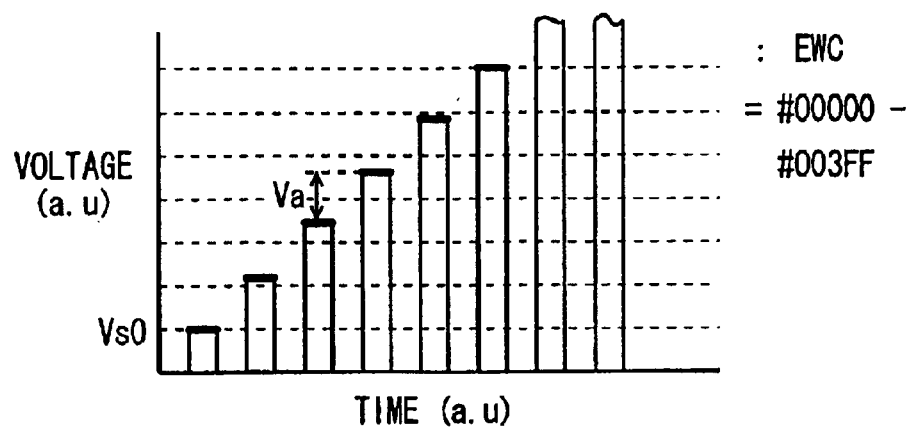
FIG. 2
FIG. 3
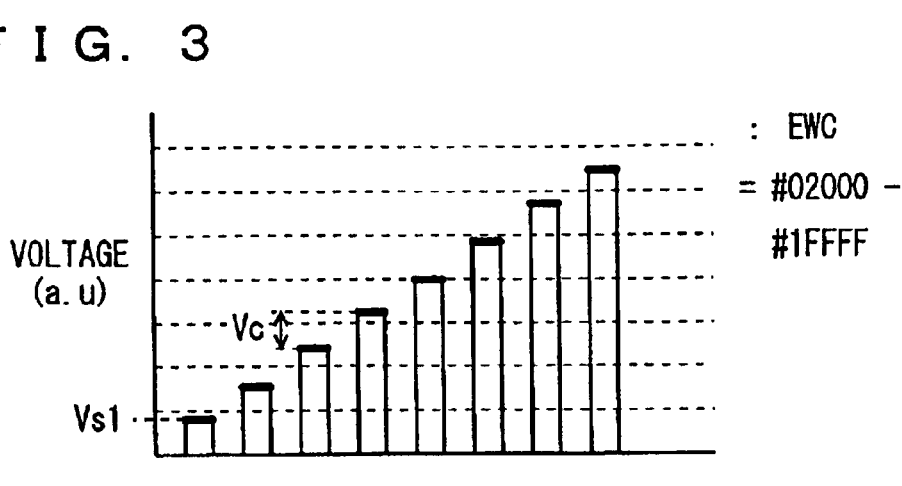

FIG. 4
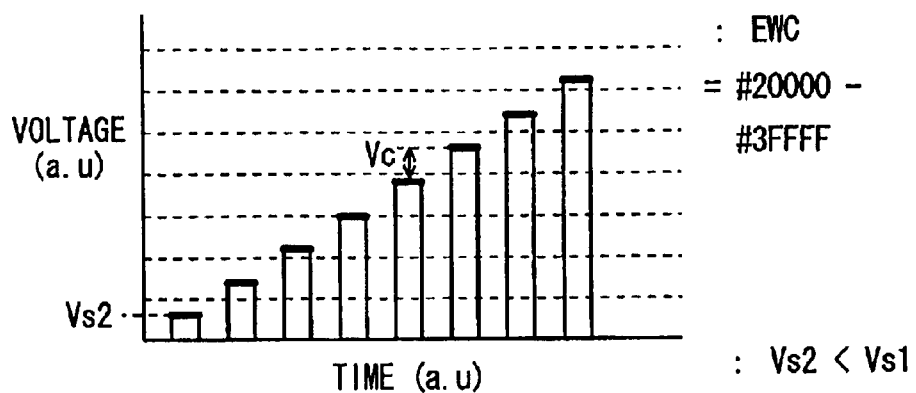
FIG. 5
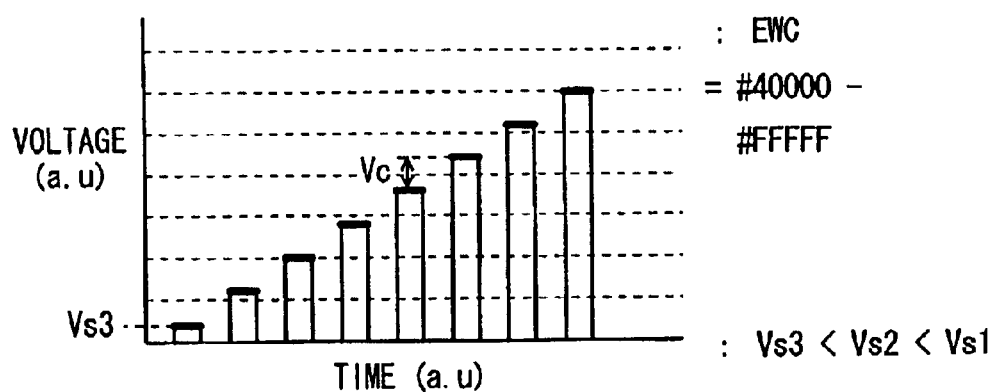
FIG. 6
| NUMBER OF TIMES OF EW (START) | NUMBER OF TIMES OF EW (END) | VOLTAGE INCREMENT WIDTH | VERIFY VOLTAGE | REWRITE START VOLTAGE | NUMBER OF TIME OF VERIFICATION |
|---|---|---|---|---|---|
| 0 | 1023 | 0.6V | 3.3V | 16.0V | 3.50 TIMES |
| 1024 | 8191 | 0.5V | 3.4V | 16.0V | 4.20 TIMES |
| 8192 | 131071 | 0.4V | 3.5V | 15.9V | 5.25 TIMES |
| 131072 | 262143 | 0.4V | 3.5V | 15.8V | 5.25 TIMES |
| 262144 | 1048575 | 0.4V | 3.5V | 15.7V | 5.25 TIMES |

| NUMBER OF TIMES OF EW (START) | NUMBER OF TIMES OF EW (END) | VOLTAGE INCREMENT WIDTH | VERIFY VOLTAGE | REWRITE START VOLTAGE | NUMBER OF TIME OF VERIFICATION |
|---|---|---|---|---|---|
| 0 | 1023 | 0.4V | 3.5V | 15.7V | 6.00 TIMES |
| 1024 | 8191 | 0.4V | 3.5V | 15.7V | 6.00 TIMES |
| 8192 | 131071 | 0.4V | 3.5V | 15.7V | 5.75 TIMES |
| 131072 | 262143 | 0.4V | 3.5V | 15.7V | 5.50 TIMES |
| 262144 | 1048575 | 0.4V | 3.5V | 15.7V | 5.25 TIMES |

EW AT INITIAL STAGE ⟶ INCREASED EW

ERASE PULSE: LOW ⟶ HIGH

UPPER FOOT VERIFY VOLTAGE VOPO : CONSTANT

ERASE START PULSE : LOW ⟶ HIGH

FIG. 18
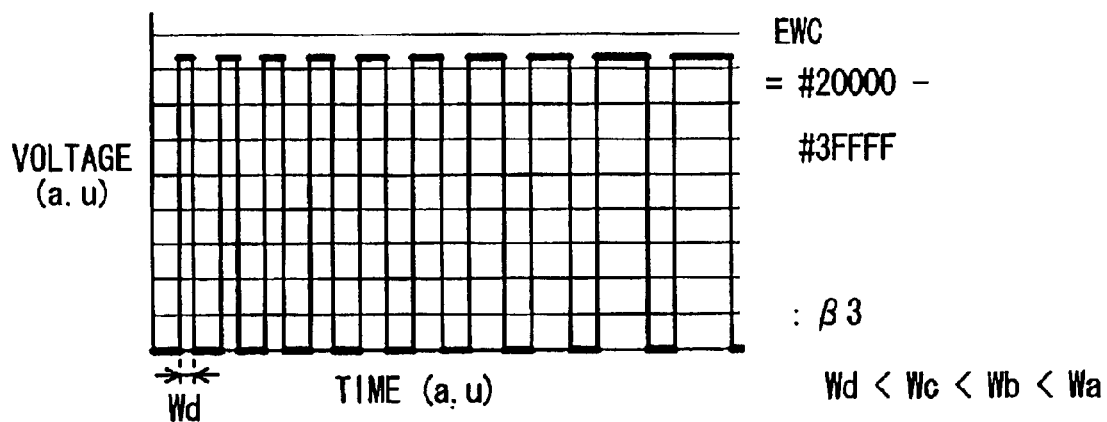
FIG. 19
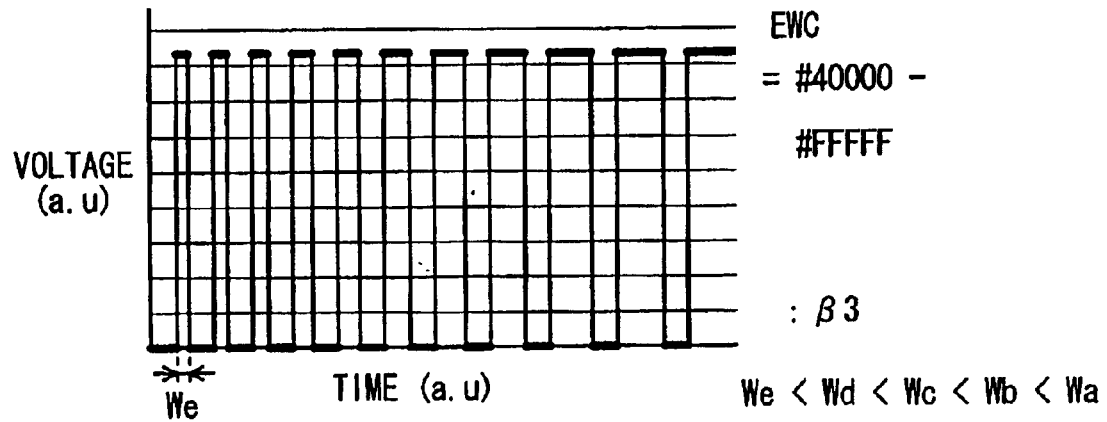
FIG. 20
| NUMBER OF TIMES OF REWRITING AT INITIAL STAGE | ⟶ LARGE |
|---|---|
| ERASE PULSE WIDTH CHANGE RATE | SMALL ⟶ LARGE |

: EWC = #00000 - #003FF

: EWC = #00400 - #01FFF

: EWC ≧ #02000

EWC : #00000 - #003FF

EWC : #00400 - #01FFF

EWC ≥ #02000

F I G. 2 8
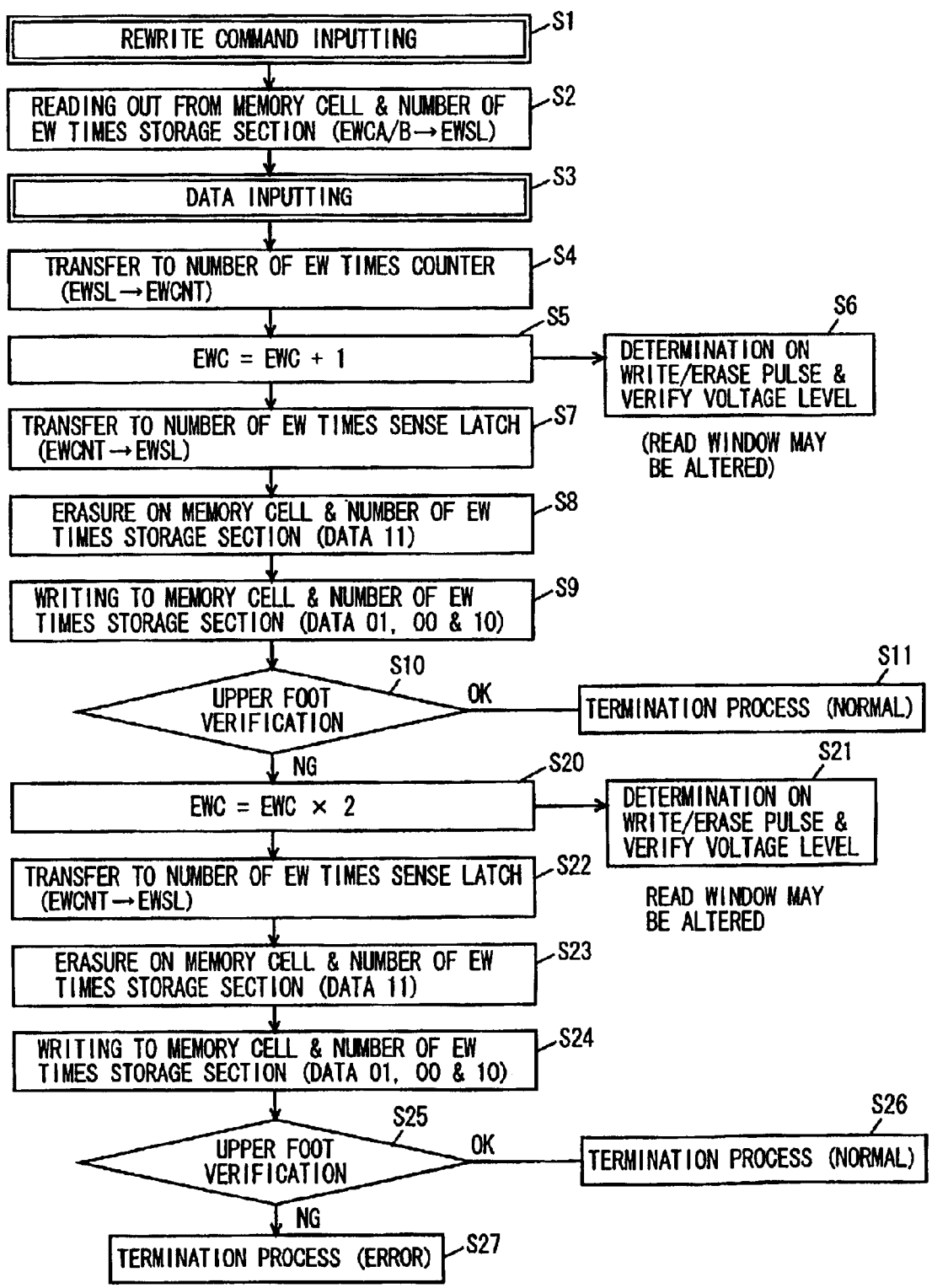

FIG. 30

| NUMBER OF EW TIMES AT START | NUMBER OF EW TIMES AT END | EWFC AT START: 0 / EWFC AT END: 3 | EWFC AT START: 4 / EWFC AT END: 7 | EWFC AT START: 8 / EWFC AT END: 15 | EWFC AT START: 15 / EWFC AT END: ... |
|---|---|---|---|---|---|
| 1 | 1023 | 3.3V/-0.0V/0.6V | 3.3V/-0.1V/0.5V | 3.3V/-0.2V/0.4V | 3.3V/-0.3V/0.3V |
| 1024 | 8191 | 3.4V/-0.0V/0.5V | 3.4V/-0.1V/0.4V | 3.4V/-0.3V/0.3V | ERROR |
| 8192 | 131071 | 3.5V/-0.1V/0.4V | 3.5V/-0.2V/0.3V | ERROR | ERROR |
| 131072 | 262143 | 3.5V/-0.2V/0.4V | 3.5V/-0.3V/0.3V | ERROR | ERROR |
| 262144 | 1048575 | 3.5V/-0.3V/0.4V | 3.5V/-0.4V/0.3V | ERROR | ERROR |

NON-VOLATILE SEMICONDUCTOR MEMORY DEVICE

BACKGROUND OF THE INVENTION

1. Field of the Invention

The present invention relates to a non-volatile semiconductor memory device, and particularly to a non-volatile semiconductor memory device in which characteristics of a memory cell changes with increase in the number of times of data rewriting. More particularly, the present invention relates to a configuration for performing a data rewriting operation in a non-volatile semiconductor memory device.

2. Description of the Background Art

In a non-volatile semiconductor memory device, writing (programming) or erasure is performed by injecting or ejecting electric charges to or from a floating gate or silicon nitride layer ($Si_xN_y$), which is electrically insulated, and provided between a word line (control gate) and a semiconductor substrate, to change a threshold voltage of a memory cell transistor.

By changing an electric charge quantity accumulated in a floating gate or a silicon nitride layer, a threshold voltage of a memory cell continuously changes. Therefore, by setting the number of segmented regions of the threshold voltage from conventional two regions to four or eight regions, 2-bit data or 3-bit data can be stored in one memory cell. Such a memory storing data of multiple bits in one memory cell (memory cell transistor) is generally called a multi-valued memory.

FIG. 32 indicates a distribution of threshold voltages of a multi-valued memory. In FIG. 32, the threshold voltage region is divided into four regions by read voltages VRW0, VRW1 and VRW2 and 4-valued or 4-level data (2-bit data) is stored in one bit memory cell.

A read voltage represents a voltage applied to the control gate of a selected memory in reading data stored in the memory cell.

In FIG. 32, the abscissa reads values of a threshold voltage of a memory cell transistor, and the ordinate indicates the number of bits. In such 4-valued memory, 2-bit data of "11", "10", "00" or "01" is stored in one memory cell. In order to perform correct reading/writing of data to/from the memory cell, restriction is imposed on distribution region of threshold voltages of memory cell transistors corresponding to the respective storage data. A threshold voltage of a memory cell transistor storing data "11" is defined to lie between a write verify voltage VWV0 and an upper foot verify voltage VOP0. A threshold voltage of a memory cell transistor storing data "10" is defined to lie between a write verify voltage VWV1 and an upper foot verify voltage VOP1.

A threshold voltage of a memory cell transistor storing data "00" is defined to lie between a write verify voltage VWV2 and an upper foot verify voltage VOP2. The lower limit of the threshold voltage of the memory cell transistor storing data "01" is defined by a write verify voltage VWV3.

Accordingly, a threshold voltage of a memory cell transistor storing data "11" lies in the lowest threshold voltage region and a threshold voltage of the memory cell transistor storing data "01" lies in the highest threshold voltage region.

FIG. 33 is a sectional diagram showing an example of a structure of a non-volatile memory cell. In FIG. 33, the memory cell includes: impurity regions S and D formed, spaced from each other, at a surface of a semiconductor substrate region SUB; a floating gate FG formed above a surface of a substrate region between impurity regions S and D with an insulating film not shown interposed in between; and a control gate CG formed in an upper layer above floating gate FG with an interlayer insulating film interposing in between.

Control gate CG is formed being integrated with a word line. Impurity regions S and D serve as source and drain regions, respectively. Floating gate FG is electrically isolated from the surroundings and accumulates electric charges according to storage data.

The non-volatile memory cell is constituted of one stacked gate field effect transistor.

In data reading, read voltages VRW0, VRW1 and VRW2 are applied in a prescribed sequence to control gate CG. Source region S is set to ground voltage level and drain region D is supplied with a prescribed read voltage (for example, 2.0 V). When a threshold voltage of the memory cell is lower than a read voltage applied to control gate CG, a channel is formed between the source and drain regions in the memory cell to cause a current to flow from the drain region to the source region.

The drain region D is connected to a data line generally called a bit line and discrimination on stored data is made according to whether or not a current flows through the bit line. In data reading, for example, read voltages VRW0 to VRW2 are sequentially applied in a prescribed sequence. When read voltages VRW0 to VRW2 are applied, it is determined whether or not a current flow through a bit line and storage data in a memory cell is identified according a result of determination.

If no current flows through a memory cell transistor even when any of read voltages VRW1 and VRW2 is applied, it is determined that data "01" is stored in the memory cell. On the other hand, if no current flows when read voltage VRW1 is applied, while a current flows when read voltage VRW2 is applied, it is determined that data "00" is stored in the memory cell.

If a current flows through a bit line when read voltage VRW0 is applied, while no current flows when each of read voltages VRW1 and VRW2 is applied, it is determined that data "11" is stored in the memory cell.

2-bit data is generated according to the results of determination and read out externally.

In data writing (programming) and erasing, in order to verify whether or not the writing/erasing is correctly performed, a verify voltage is applied to the control gate of the memory cell. In FIG. 33, there are also shown both of a control gate voltage and a bit line voltage applied in the verifying operation. A voltage in a range from 1.0 V to 6.0 V is applied to the control gate according to an operating mode and a voltage in the range from 0.5 V to 2.0 V is applied to the bit line (drain region D) according to an operating mode.

In a non-volatile semiconductor memory device, writing/erasing is implemented by moving electric charges through an insulating film immediately below a floating gate to change the electric charge quantity of the floating gate. Write (programming) characteristics or erasure characteristics of such a memory cell single is greatly varied by an influence of a film quality of the insulating film below the floating gate. Therefore, if a one shot writing pulse is generated in accordance with an externally applied write instructing signal as is done in a dynamic random access memory (DRAM) or a static random access memory (SRAM), writing and erasure cannot be performed such that threshold voltage of a memory cell falls within a prescribed range with sufficient correctness.

Therefore, it is needed to control a threshold voltage of a memory cell using an internal controller. As an example of control of a threshold voltage, a case is considered in which as shown in FIG. 34, electrons e are injected to floating gate FG from semiconductor substrate region SUB through Fowler-Nordheim (FN) tunneling phenomenon, thereby raising a threshold voltage of a memory cell transistor. Here, an operation of raising a threshold voltage of a memory cell is defined as writing.

In writing, a voltage in the range from 15 to 25 V is applied to control gate CG and source region S and drain region D is maintained at ground voltage level. In this state, a high electric field is applied between substrate region SUB and control gate CG to cause a FN tunneling phenomenon. Accordingly, electrons, e, flow through the insulating film between floating gate FG and substrate region SUB and are accumulated in floating gate FG and to raise the threshold voltage of the memory cell transistor.

Now, a case is considered in which a write pulse with a prescribed constant width at a prescribed constant voltage level is applied to control gate CG. In this case, as shown in FIG. 35, due to differences in characteristics among memory cells, a memory cell fast in writing has a threshold voltage attaining 5.0 V, while a memory cell slow in writing has a threshold voltage attaining 3.0 V. Herein, in FIG. 35, the ordinate indicates the number of bits and the abscissa indicates values of a threshold voltage Vth. The memory cell fast in writing, or the fast writing memory cell signifies a memory cell having a threshold voltage changed even greater under the same writing condition, as compared to the memory cell slow in writing, or the slow writing memory cell.

For memory cells with such varied write characteristics, the following procedure is required in order to confine the threshold voltages within a voltage region between 3.5 V and 3.9 V corresponding to data "00" of a multi-valued memory shown in FIG. 32.

Step 1:

First, a write pulse is applied with which a threshold voltage of the fastest memory cell does not exceed 3.9 V. Memory cells have characteristics as shown in FIG. 35 and threshold voltages of the memory cells distribute in the range, for example, from 1.9 V to 3.9 V by the first write pulse, as shown in FIG. 36.

Next, it is determined whether or not a threshold voltage exceeds 3.5 V on all of memory cells subject to writing, and a memory cell with a threshold voltage of 3.5 V or higher is excluded from writing targets (a verify operation).

Step 2:

Next, a write pulse, with which a threshold voltage of the fastest memory cell among memory cells having threshold voltages not exceeding 3.5 V in the first writing does not exceed 3.9 V, is applied to the control gates of memory cells of write targets. That is, a write pule is applied with which a threshold voltage of the fastest memory cell among memory cells of interest rises by 0.4 V.

Next, it is again determined whether or not all memory cells subject to writing exceed 3.5 V and a memory cell with a threshold voltage of 3.5 V or higher is excluded from writing targets. In the second write pulse application, a threshold voltage of the slowest memory cell rises and in FIG. 37, a threshold voltage of the slowest memory cell rises up to 2.3 V.

The above process is repeated till a threshold voltage of the slowest memory cell rises to 3.5 V or higher. Finally, the threshold voltages of memory cells are distributed within the range from 3.50 to 3.9 V, as shown in FIG. 38.

In the writing, a write pulse is applied such that a threshold voltage of the fastest memory cell, among memory cells with threshold voltages of 3.5 V or lower, does not exceed 3.9 V. Therefore, differences in threshold voltage among memory cells attain 0.4 V at the maximum. Accordingly, when a threshold voltage of the slowest memory cell is 1.9 V as shown in FIG. 36, it is needed to repeat at least five times application of a write pulse, followed by a verifying operation for detecting write targets.

In a case where variations in characteristics among memory cells increase and in a case where a control range for a threshold voltage is required to be narrower, an increased number of times of repetition of application of write pulses followed by verify operations is required.

As for a slower memory cell, injection of a greater quantity of electric charges is required in order to cause the same voltage change in threshold voltage. That is, a more intensive write pulse is required to be applied in writing at the (N+1)-th time than in writing at the N-th time, where $N \geq 2$.

The following method can be considered for application of such a write pulse.

That is, a voltage level of a pulse is successively raised with a pulse width being kept constant. Here, in FIG. 39, the abscissa indicates the time, while the ordinate indicates a voltage. Both units of the coordinates are arbitrary (a.u).

Moreover, a method can be considered, as shown in FIG. 40, in which a pulse width of the write pulse is successively broadened. A further method can be considered, as shown in FIG. 41, in which a pulse width and voltage level of a write pulse are increased with increase in the number of times of writing. In each of FIGS. 40 and 41, the horizontal axis indicates the voltage in arbitrary units and the vertical axis indicates the time in arbitrary units.

As shown in FIG. 42, threshold voltages (Vth) of memory cells, after data is written, are distributed between write verify voltage VWV and upper foot verify voltage VOP. In detection of a write target, write verify voltage VWV is used. Verification is performed using upper foot verify voltage VOP after completion of writing.

In an operation, there arise variations in memory cell threshold voltage caused by a variation in read (and verify) voltage due to a variation in power supply voltage and a variation in operating temperature, and a variation in memory cell threshold voltage within an operation guaranteed period is also caused. In order to perform correct reading of data even if such variations occur, threshold voltage needs to be controlled such that margins are present between write verify voltage VWV (in the above example, 3.5 V) and lower side read voltage VRWL (in this example, 3.0 V), and between upper foot verify voltage VOP (3.9 V) and upper side read voltage VRWu (4.0 V).

A function of performing the above writing operation under the control of a controller provided in a memory chip is called "auto-writing function." The controller is usually constituted of a CPU (central processing unit) and the write operation is performed on the basis of software.

In a non-volatile semiconductor device, an erase operation is performed prior to rewriting of data. In an erase operation, as shown in FIG. 43, a negative voltage in the range from −15 to −25 V is applied to control gate CG and source region S and drain region D are set to ground voltage level. In this case, substrate region SUB is also at ground voltage level and electrons e flows out from floating gate FG into substrate region SUB to lower a threshold voltage of a memory cell transistor. In such a state where electrons are extracted from the floating gate, there is caused an over erasure state that a threshold voltage of a memory cell assumes a negative value. In the over erasure state, since a memory cell is conductive even if a voltage of the control gate is at ground voltage level, a write-back operation raising the threshold voltage is performed after the erasing.

In the write-back operation, a threshold voltage is controlled such that the threshold voltage lies between write verify voltage VWV0 and upper foot verify voltage VOP0. The write-back state is called an erasure state, and usually corresponds to a state of the lowest threshold voltage, or a state where data "11" is stored.

In the erasing operation, memory cells storing data "10", "00" and "01" have their threshold voltages lowered to be set to a state of storing data "11". Therefore, there are memory cells with various threshold voltages. Erasure is performed collectively in a sector unit. In a case where there exists a memory cell with a threshold voltage of upper foot verify voltage VOP or higher, a pulse is applied with which a threshold voltage of the slowest memory cell among memory cells each with a threshold voltage of upper foot verify voltage VOP or higher attains upper foot verify voltage VOP or lower. Therefore, in erasure, since the maximum threshold voltage is lowered according to application of an erase pulse, a pulse width or voltage level of the erase pulse is successively lowered, contrary to the case of writing.

When threshold voltages of all memory cells of interest attain the upper foot verify voltage or lower, writing-back is performed to distribute threshold voltages of the memory cells between write verify voltage VWV0 and upper foot verify voltage VOP0 shown in FIG. 32. The write-back operation is the same as that in writing of data "11."

In the erasure as well, accordingly, application of an erase pulse and an erase verify operation are performed on each data. The erase operation is also performed by the controller provided in a memory chip and an erasure operation performed under control of the controller is called an auto-erase function.

The control of such auto-writing and auto-erasure is set taking into account a change in memory cell characteristics due to erasure/writing, or rewriting of a memory cell. Since in writing/erasing of data on a memory cell, a high voltage is applied between a control gate and a substrate region, characteristics of the memory cell changes due to a change in property of an insulating film (tunnel insulating film) between a floating gate and the substrate region, trapping of an electric charge in the insulating film and others. The following is an example of automatic rewrite control taking into account a change in write/erasure characteristics due to such erasure/writing (rewriting).

FIRST EXAMPLE

Pulse Setting in Consideration of Change in Write/Erasure Characteristics Due to Rewriting FIG. 44 shows a change in write/erase characteristics of a memory cell due to rewriting. The ordinate indicates a threshold voltage Vth of a memory cell when a pulse is applied under predetermined conditions of a constant voltage and a constant time period, while the abscissa indicates the number of times of rewriting. In FIG. 44, "1.E+n" represents the +n-th power of 10. A filled circle symbol indicates a threshold voltage Vth after writing and an empty circle symbol indicates a threshold voltage after erasure.

As shown in FIG. 44, as the number of times of rewriting increases, threshold voltages Vth of a memory cell after writing and after erasure both increase.

FIG. 45 shows a distribution of threshold voltages after rewriting. In FIG. 45, the ordinate indicates the number of bits, while the abscissa reads values of a threshold voltage. A curve I shows a distribution of threshold voltages after completion of the first rewriting and a curve II indicates a distribution of threshold voltages after rewriting is performed one million times. Since a threshold voltage Vth of a memory cell increases by the order of 0.4 V after the number of times of rewriting reaches one million times, the curve II becomes a curve shifting in the direction of a higher voltage by 0.4 V relative to the curve I.

Accordingly, there arises a difference in threshold distribution between when a first write pulse is applied in the first rewriting and when a first write pulse is applied after one million times of rewriting.

FIG. 46 shows a distribution of threshold voltages in the case when the first write pulse is applied after one million times of rewriting. In FIG. 46, the abscissa indicates values of a threshold voltage, while the ordinate indicates the number of bits.

In FIG. 46, a memory cell, a threshold voltage of which reaches 3.9 V when a write pulse is applied one time in the first time rewriting, has the threshold voltage attaining 4.3 V when a first write pulse is applied thereto after one million times of rewritings, thus exceeding the upper limit value (the upper foot verify voltage) 3.9 V of a control range of a threshold distribution. Accordingly, in order to design a non-volatile semiconductor memory device to guarantee one million times of rewriting operations, it is required to set, taking into account the increase in threshold value by 0.4 V after one million times of rewriting, a threshold voltage of the fastest memory cell to b e lower than 3.5 V by application of the first writing pulse in the first time rewriting. With such a setting, the threshold voltage of the fastest memory cell is attains 3.9 V after one million times of rewriting, thereby enabling the threshold voltages to fall within a desired threshold voltage control range.

In this case, for a distribution of threshold voltages of memory cells, it is necessary to consider threshold voltage distribution ranges of both curves I and II shown in FIG. 45, and therefore, it is necessary to consider the variation of threshold voltage of 2.4 V as the threshold distribution width. Therefore, in the case where a threshold voltage shifts by 0.4 V by one write pulse, it is necessary to repeatedly perform application of the write pulse followed by verifying operation at least six times, leading to an increased write time.

In the case of erasure, a memory cell after one million times of rewriting demonstrates a slower erasure than a memory cell in the first time rewriting. That is, a threshold voltage distribution curve in application of an erasure pulse in the first rewriting of a memory cell subject to one million times of rewriting shifts in a higher threshold voltage direction by 0.4 V relative to a threshold voltage distribution curve of a memory cell after application of an erase pulse in the first time rewriting. Therefore, while a threshold voltage of a memory cell is prevented from falling outside a control range thereof by application of an erase pulse in the first erasure, threshold voltage Vth of the memory cell subject to one million times of rewriting stays in a higher level even after application of an erase pulse of the first time in the rewriting.

In this erasure as well, accordingly, in order to perform correct erasure after one million times of rewriting, it is needed to set an erase pulse, taking into account a threshold voltage distribution width of 2.4 V. Therefore, in a case of erasure as well, application of an erase pulse and a following erase verify operation are required to repeat more times by the number of times corresponding to increased variation width of threshold voltage, resulting in increased erasing time.

SECOND EXAMPLE

Pulse Setting in Consideration of Change in Data Holding Characteristics Due to Rewriting FIG. 47 shows a relationship between a change in threshold voltage when data is held in a memory cell and the number of times of rewriting. In FIG. 47, the ordinate indicates a change amount in threshold voltage $\Delta Vth$, while the abscissa indicates the number of times of rewriting. A change amount in threshold voltage $\Delta Vth$ indicates a change in threshold voltage of a memory cell when a prescribed time elapses immediately after data writing. As shown in FIG. 47, as the number of times of rewriting increases, a change amount in threshold voltage $\Delta Vth$ becomes larger, and accordingly, a threshold voltage is lowered.

As for a margin for correct reading of data, as shown in FIG. 48, it is required that a margin $\Delta M$ for variations in power supply voltage and temperature and the change amount in threshold voltage $\Delta Vth$ are secured between lower side read voltage VRW and write verify voltage VWV being the lower limit voltage of the threshold voltage In the first time rewriting, change amount in threshold voltage $\Delta Vth$ is 0.1 V or lower. Therefore, 0.2 V is sufficient for a difference between write verify voltage VWV and lower side read voltage VRW, with the assumption of 0.1 V for variation factors in lower side read voltage VRW due to power supply voltage and temperature and in threshold voltage of a memory cell.

After one million times of rewriting, however, change amount in threshold voltage $\Delta Vth$ attains 0.4 V. Therefore, with consideration of variations caused by power supply voltage and temperature, 0.5 V is required for a difference $\Delta M+\Delta Vth$ between write verify voltage VWV and read voltage VRW.

In a 4-valued non-volatile semiconductor memory device as shown in FIG. 32, it is assumed that read voltages VRW0, VRW1 and VRW2 are 2.0 V, 3.0 V and 4.0 V, respectively, in normal data reading. A difference between adjacent read voltages is 1.0 V. If consideration is given on a change due to power supply voltage and temperature of 0.1 V·2 and a change in threshold voltage after one million times of rewriting of 0.4 V, as shown in FIG. 49, it is required to confine a threshold voltage distribution immediately after writing within a control region of 0.4 V as a control region (control width) of a threshold voltage.

That is, in a case where a threshold voltage distribution after one million times of rewriting is limited within a region ranging from 3.5 V to 3.9 V as shown in FIG. 50, a threshold voltage Vth shifts by 0.4 V after data is held. In this case, since there is variations in data holding characteristics of memory cells, a threshold voltage region ranges from 3.1 V to 3.9 V. Accordingly, even if a threshold voltage distribution is broadened to 3.1 V after data is held, lower side read voltage VRW1 is at 3.0 V, thereby enabling a margin of 0.1 V to be secured.

In a case where data writing is performed to a memory cell in an initial stage of rewritings, a threshold voltage changes by only 0.1 V even after data is held. Accordingly, if a threshold voltage control range is determined in consideration of a change in threshold voltage after one million times of rewriting, for the memory cells at an initial stage of rewriting, the lower limit value of a threshold voltage distribution changes from 3.5 V to 3.4 V only as shown in FIG. 51. There still exists a margin of 0.4 V for lower read voltage VRW1, and there is fully sufficient margin.

In a non-volatile semiconductor memory, as described above, conditions for a write pulse and an erase pulse are set in data rewriting of a memory cell, in consideration of the worst case of a write/erase characteristics of a memory cell. The conditions are in common to all the subsequent rewritings irrespective of the number of times of rewriting. Thereby, in all of the rewritings, a margin is allowed to present between a read voltage and a threshold voltage distribution region, to prevent erroneous data reading.

When the number of times of rewriting is small, there exists a margin larger than necessary. Writing/erasure is performed according to pulse conditions with an excessive margin, leading to a problem that inherent performance of memory cells cannot be sufficiently made used of.

Particularly, in a case where a control width for a threshold voltage is narrowed, a change in threshold voltage caused by a write pulse becomes smaller, and therefore, the number of application times of write pulse increases to increase the write time and to accelerate degradation in an insulating film of a memory cell.

Moreover, a threshold voltage rises with increase in the number of times of rewritings. If the change in threshold voltage due to erasure pulse is increased to compensate for the increased threshold voltage, an erase pulse larger than necessary is applied at an initial stage of rewriting, memory cell characteristics might be possibly degraded. Furthermore, since a shift in threshold voltage is large, write-back pulse has to be applied much more times in write-back operation than in rewriting after one million times of rewriting, leading to degradation in memory cell characteristics and an increased erase time.

SUMMARY OF THE INVENTION

It is an object of the present invention to provide a non-volatile semiconductor memory device capable of reducing a time required for data rewriting.

It is another object of the present invention to provide a non-volatile semiconductor memory device capable of providing a margin according to characteristics of a memory cell to rewritten data.

It is still another object of the present invention to provide a non-volatile semiconductor memory device capable of performing rewriting of data while fully utilizing characteristics of a memory cell.

It is a further object of the present invention to provide a non-volatile semiconductor device having long lifetime memory cells, and capable of rewriting data at a high speed without damaging reliability of a memory cell.

A non-volatile semiconductor memory device according to a first aspect of the present invention includes: a plurality of memory cells for storing data in a non-volatile manner; a number of rewriting storage circuit for storing the number of times of rewriting of storage data in the plurality of memory cells; and a rewrite condition control circuit for setting a condition on a rewrite pulse including at least one of a write pulse for writing data and an erase pulse for erasing storage data in accordance with stored data in the number of rewriting storage circuit. The set condition for at least one of a write pulse and an erase pulse can be altered in accordance with the number of times of rewriting.

A non-volatile semiconductor memory device according to a second aspect of the present invention includes: a plurality of non-volatile memory cells for storing data in a non-volatile manner; a number of rewriting storage circuit for storing the number of times of rewritings of storage data in the plurality of non-volatile memory cells; and a write condition control circuit for, in rewriting data of the memory cells, setting a condition for a write pulse for writing data in accordance with the number of times of rewritings indicated by storage data in the number of rewriting storage circuit.

A non-volatile semiconductor memory device according to a third aspect of the present invention includes: a plurality of non-volatile memory cells for storing data in a non-volatile manner; a number of rewriting storage circuit for storing the number of times of rewriting of storage data in the plurality of non-volatile memory cells; and an erase condition control circuit for, in rewriting data of the memory cells, setting a condition for an erase pulse for erasing data in accordance with the number of times of rewriting indicated by storage data in the number of rewriting storage circuit.

By changing a set condition for a rewrite pulse including at least one of a write pulse and an erase pulse in accordance with the number of times of rewriting, a rewrite pulse in an optimal condition can be applied even in a case where characteristics of a memory cell is varied in accordance with the number of times of rewriting and there is no need to perform rewriting in a pulse condition accounting for a margin more than necessary. Rewriting can be performed in a rewrite time according to characteristics of a memory cell. Thus, a rewrite time can be reduced and memory characteristics can be prevented from degrading.

Furthermore, by changing a condition set for a write pulse in accordance with the number of times of rewriting, a write pulse in an optimal condition can be applied even in a case where characteristics of a memory cell is different in accordance with the number of times of rewriting. There is no need to perform rewriting in a pulse condition set accounting for a margin more than necessary. Rewriting can be performed in a write time according to characteristics of a memory cell. Thereby, a rewrite time can be reduced and a memory characteristic can be prevented from degrading.

Moreover, by changing a condition set for an erase pulse in accordance with the number of times of rewriting, an erase pulse in an optimal condition can be applied even in a case where characteristics of a memory cell is different in accordance with the number of times of rewriting. There is no need to perform erasure in a pulse condition set accounting for a margin more than necessary. Erasure can be performed in an erase time according to characteristics of a memory cell. Thereby, an erase time can be reduced and memory characteristics can be prevented from degrading.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 5 are graphs each showing a write pulse series according to a first embodiment of the present invention;

FIG. 6 is a table showing, in a list form, the number of times of rewriting and set conditions for a write pulse in the first embodiment of the present invention;

FIGS. 15 to 19 are graphs showing write pulse sequences according to a second embodiment of the present invention;

FIG. 20 is an illustration showing conditions for an erase pulse according to the second embodiment;

FIG. 28 is a flow chart representing an operation in data rewriting of a non-volatile semiconductor memory device according to a fourth embodiment of the present invention;

FIG. 30 is a table showing, in a list form, the number of times of erroneous rewriting and set conditions for a rewrite pulse in the fifth embodiment of the present invention;

DESCRIPTION OF THE PREFERRED EMBODIMENTS

[First Embodiment]

FIGS. 1 to 5 are graphs each showing setting of a write pulse series according to a first embodiment of the present invention. As shown in FIGS. 1 to 5, by performing setting of a write pulse corresponding to characteristics of a memory cell according to a number of rewriting count value EWC, a write time is reduced while maintaining reliability of a memory cell. Here, number of rewriting count value EWC indicates the number of times of rewriting stored in a number of rewriting storage section described later. In a case where rewriting to a memory cell is actually performed, an actual number of times of rewriting of the memory cell is greater by one than a number of rewriting count value EWC stored therein. In the following description, a stored number of times of rewriting is regarded as the number of rewriting count value EWC.

At an initial stage of a region from #00000 to #003FF (a region from the first writing to the 1023-rd rewriting) in the number of rewriting count value EWC, a threshold voltage changes only by 0.1 to 0.2 V or so even after data is held. Therefore, even if a write verify voltage is lowered to 3.3 V to set a control width in which threshold voltages are distributed to 0.6 V, a margin for a lower side read voltage can be secured sufficiently. At an initial stage of rewriting shown in FIG. 1, therefore, a control width in which threshold voltages are distributed is increased and an incremented width of a write pulse voltage is set large to a voltage Va. Thereby, even a memory cell slow in writing can shift a threshold voltage thereof within a control width region by application of a small number of write pulses. Thereby, writing can be completed in a small number of times of verification (a verify operation of excluding a memory cell from write target).

In FIG. 2, in a region from #00400 (at the 1024 rewriting) to #01FFF (at the 8191-st rewriting) in the number of rewriting count value EWC, a threshold voltage changes by a value of 0.2 to 0.3 V or so after data is held. Therefore, write verify voltage VWV is set to 3.4 V and a control width thereof is set to 0.5 V. In this case, an increment width of a write pulse voltage is set a voltage Vb and voltage Vb is adjusted to be smaller than a voltage change width Va at the initial stage of rewriting.

Figure 44:
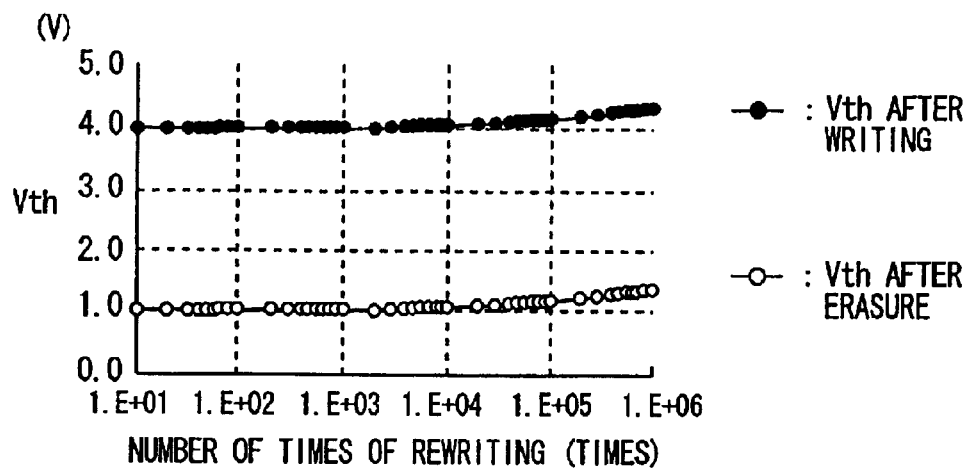
FIG. 44 is a graph showing a relationship between the number of times of rewriting and a threshold voltage of a non-volatile memory cell.
Figure 45:
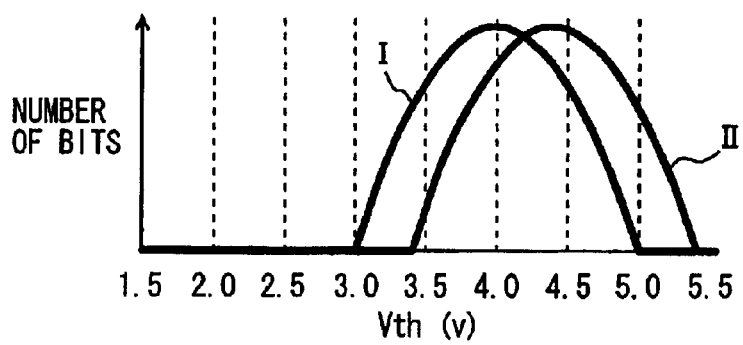
FIG. 45 is a graph showing a relationship between the number of times of rewriting and a threshold voltage distribution region.
Figure 46:
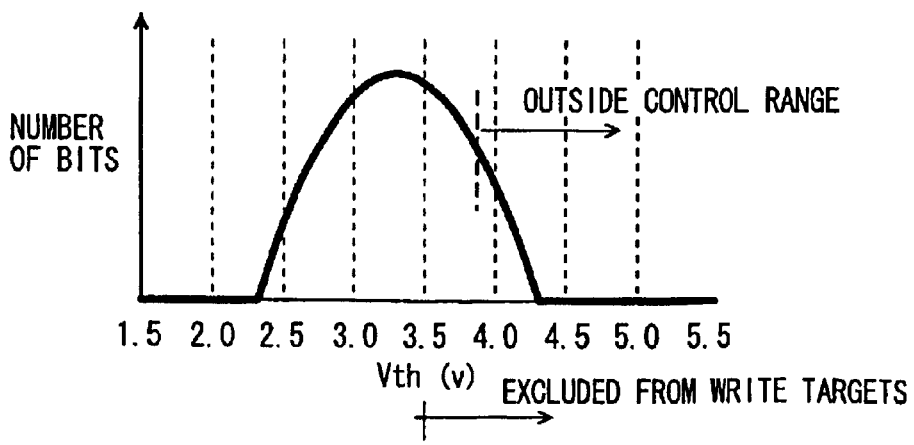
FIG. 46 is a graph showing a threshold voltage distribution region in writing of a conventional non-volatile memory cell.
Figure 47:
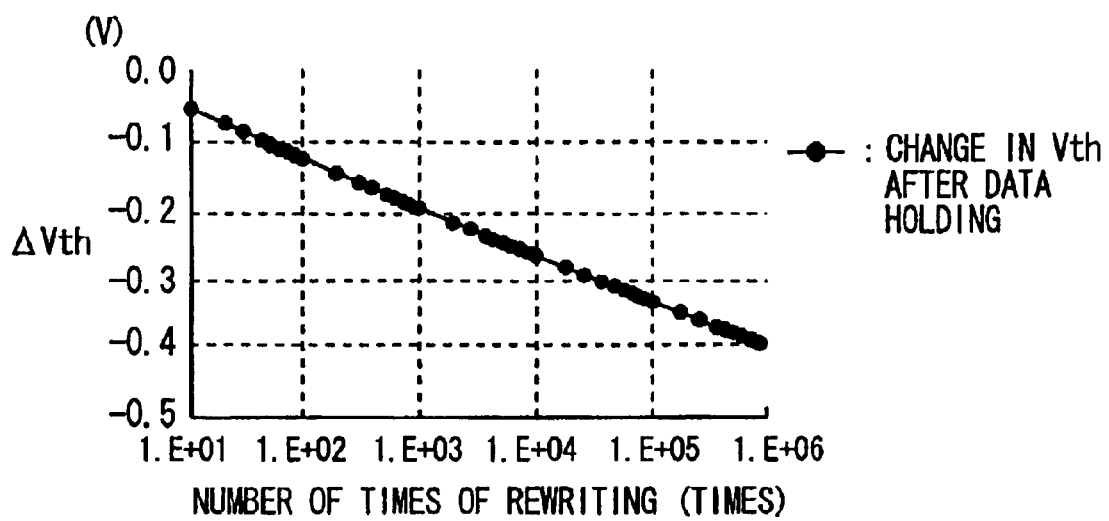
FIG. 47 is a graph showing a relationship between the number of times of rewriting and a change amount in threshold voltage of a conventional non-volatile memory cell.
Figure 48:
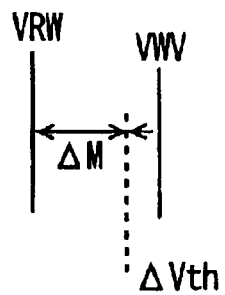
FIG. 48 is an illustration showing a margin for write verify voltage and lower side read voltage of a non-volatile memory cell.
Figure 49:
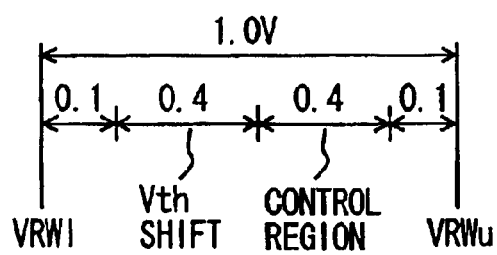
FIG. 49 is an illustration showing an example of a construction of a read window of a conventional non-volatile memory cell.
Figure 50:
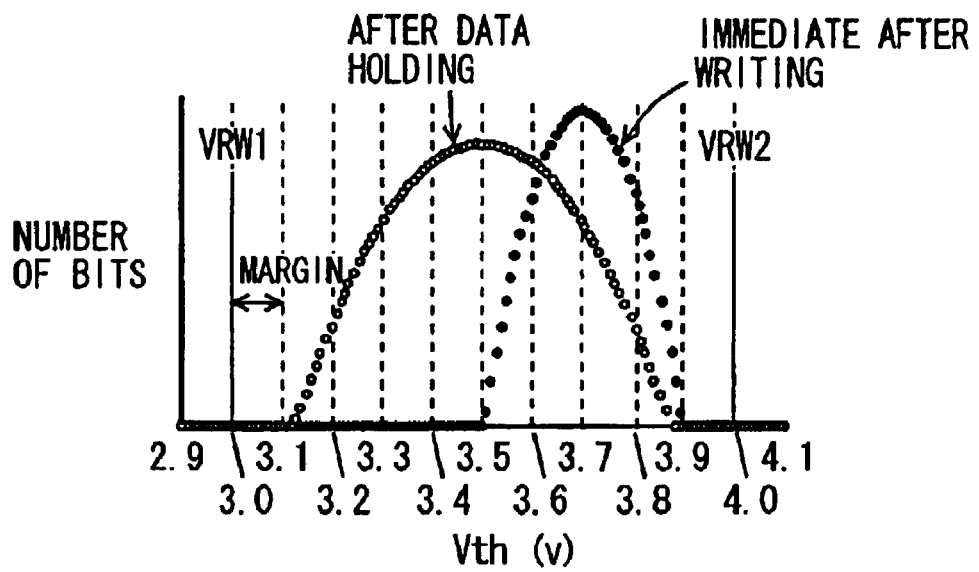
FIG. 50 is a graph showing a change in threshold voltage after data is held in a conventional non-volatile memory cell.
Figure 51:
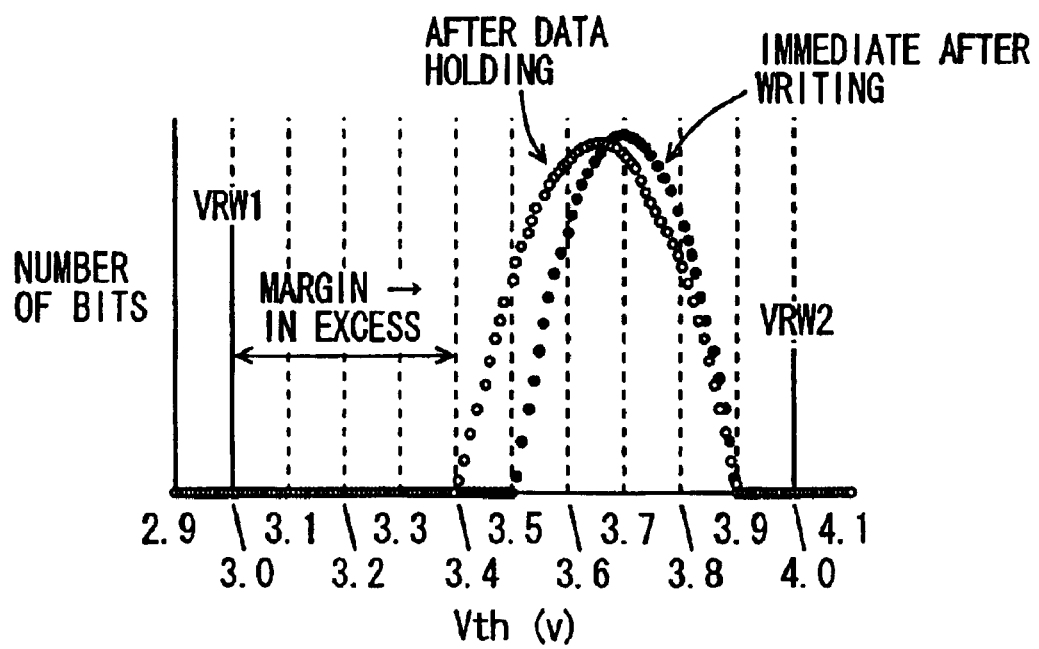
FIG. 51 is a graph showing a conventional change in threshold voltage, after data is held, at an initial stage of rewriting of a non-volatile memory cell.

This is because with increase in the number of times of rewriting, a threshold voltage increases as shown in FIG. 44. If a write pulse is incremented by voltage change width Va successively, there is a possibility that a threshold voltage of a memory cell eventually exceeds a control width.

Next, referring to FIG. 3, in a region from #02000 (at the 8192-nd rewriting) to #1FFFF (at the 131071-st rewriting) in the number of rewriting count value EWC, a threshold voltage changes by about 0.4 V after data is held. Therefore, write verify voltage VWV is set to 3.5 V and a control width is set to 0.4V. An increment width of a write pulse voltage at this time is somewhat smaller than voltage Vb and is set to a voltage Vc. Since write characteristics of a memory cell becomes faster, a voltage level of a voltage at the first write pulse (hereinafter referred to as a write start voltage) is set to a voltage Vs1 somewhat smaller than write start voltage Vs0 shown in FIGS. 1 and 2.

Next, in a region from #20000 to #3FFFF (from the 131072-nd rewriting to the 262143-rd rewriting) in the number of rewriting count value EWC, write characteristics of a memory cell become further faster, and a write start voltage is set to a lower value of a voltage Vs2 in this rewriting. A voltage change width of a write pulse is voltage Vc.

Next, as shown in FIG. 5, in a region from #40000 to #FFFFF (from the 262144-th rewriting to the 1048575-th rewriting) in the number of rewriting count value EWC, write characteristics of a memory cell become still further faster, and a write start voltage is set a further lower value of a voltage of Vs3.

FIG. 6 is a table showing, in a list form, an example of setting of write pulse conditions. In a region from 0 to 1023 counts of the number of rewriting count value EWC, a voltage increment width Va is set to 0.6 V and a write verify voltage is set to 3.3 V. Write start voltage is set to 16.0 V. The number of times of verify operation at this time is 3.50, which in turn is represented by an average value.

On the other hand, in a region from 1024 to 8191 of the number of rewriting count value, voltage incremented width Vb is set to 0.5V and write verify voltage is set to 3.4 V. A rewrite start voltage is 16.0 V. The number of times of verify operation at this time is 4.20.

In a region from 8192 to 131071 of the number of rewriting count value, a voltage increment width Vc is set to 0.4 V and a write verify voltage is set to 3.5 V. A rewrite start voltage is 15.9 V. The number of times of verify operation at this time is 5.25.

In a region from 131072 to 262143 in the number of rewriting count value, a voltage increment width Vc is set to 0.4 V and a write verify voltage is set to 3.5 V. A rewrite start voltage Vs2 at this time is set to 15.8 V. The number of times of verify operation is 5.25.

On the other hand, in a region from 262144 to 1018575 of the number of rewriting count value, a voltage increment width Vc is 0.4 V and a write verify voltage is set to 3.5 V. A rewrite start voltage Vs is set to 15.7 V. The number of times of verify operation at this time is 5.25.

At an initial stage, therefore, the number of verify operations is small and accordingly, an application time of a write pulse can be shorter and degradation in an insulating film of a memory cell is suppressed and a write time can be also shorter.

An upper foot verify voltage is set at a constant voltage of 3.9 V in the first embodiment. Accordingly, as a voltage level of a write verify voltage rises, a control width (a width of a threshold voltage distribution region) is narrowed and a margin for a lower side read voltage becomes larger.

Figures 7, 8, 9:
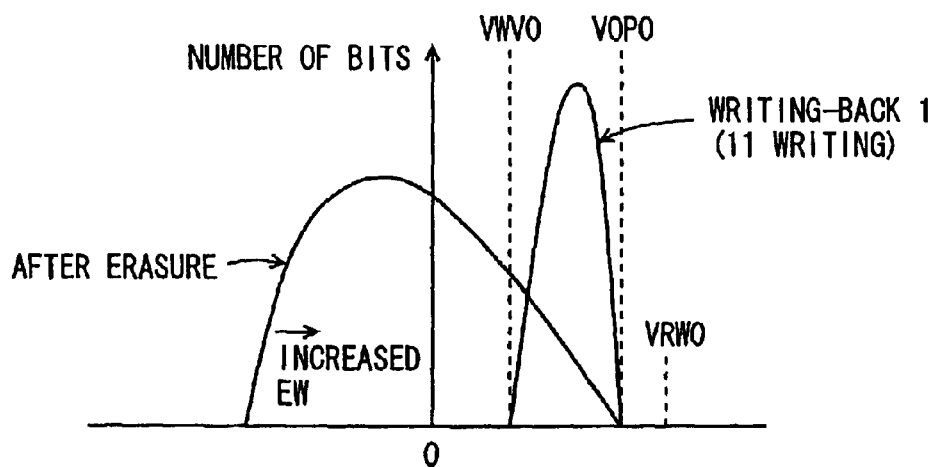
FIG. 7 is a table showing, in a list form, conventional set conditions for a write pulse and the number of times of rewriting.
FIG. 8 is a graph schematically showing a threshold voltage distribution in erasure in the first embodiment of the present invention.
FIG. 9 is an illustration showing a relationship between a set condition for an erase pulse voltage and the number of times of rewriting according to the first embodiment of the present invention.

FIG. 7 is a table showing, in a list form, conventional set conditions for a write pulse and the number of times of rewriting. Conventionally, a voltage increment width is fixedly set to 0.4 V and a write verify voltage is fixedly set to 3.5 V irrespective of the number of times of rewriting. Furthermore, a rewrite start voltage is also fixedly set to 15.7 V.

That is, in a conventional construction, a voltage increment width, a verify voltage and a rewrite start voltage are set accounting for a case where the number of times of rewriting is the greatest. In this case, the number of times of verification is 6.0 in a region from 0 to 8091 of rewriting count value, and is 5.75 in a region from 8192 to 131071 of rewriting count value. The number of times of verification is 5.50 in a region from 131072 to 262143 in rewriting count value while being 5.25 in a region from 262144 to 1048575 in rewriting count value.

That is, in a case where a write condition is fixedly set accounting for a margin for guaranteeing one million times of rewriting, the number of times of verification is as large as 6 at an initial stage of rewriting as shown in FIG. 7 and it is seen in this first embodiment that the number of times of write verification is greatly improved at the initial stage of rewriting.

FIG. 8 is a graph schematically showing a threshold voltage distribution in erasure. Generally, collective erasure is performed in units of sectors. Here, a sector is constituted of memory cells connected to one word line. An erase pulse is applied commonly to the memory cells of a selected sector. Therefore, threshold voltages of the memory cells are distributed from a negative voltage to upper foot verify voltage VOP0 according to stored data in the memory cells.

As for application of an erase pulse, the erase pulse is applied to set the threshold voltages to be lower than upper foot verify voltage VOP0. In this case, similarly to writing, with increase in number of times of rewriting, a threshold voltage distribution after the erasure shifts to the right side in FIG. 8, thereby causing erasure to be more difficult. That is, as the number of times of rewriting increases, the number of memory cells lower in threshold voltage than upper foot verify voltage VOP0 decreases, thereby causing erasure to be more difficult. Therefore, a voltage level of an erase pulse is increased according to an increased number of times of rewritings. Thereby, reduction can be effected in the number of times of erase verification for detecting an existence of a memory cell as an erasure target using upper foot verify voltage VOP0.

An erase pulse with which the slowest memory cell exceeds the upper foot verify voltage of data "11" is applied as an erasing pulse in the erasure, and an erase verify operation is performed. When a memory cell to be erased exists, an erase pulse with which the upper foot verify voltage is exceeded by the second slowest memory cell is applied. At this time, threshold voltages of all the memory cells to be erased are lowered by the first-time application of an erase pulse. An erase pulse is not one pulse but a pulse series, similarly to the case of a write pulse, and a voltage level of the erase pulse is successively decreased.

In a state where the erasure is completed and positive and negative threshold voltages of memory cells are present in a mixed manner, writing-back, or writing of "11," is performed. A write-back operation is the writing of data "11" and similarly to writing, write verify voltage VWV0 is successively raised as the number of times of rewriting increases, and a pulse set condition for a write pulse is set in a similar manner to that as shown in FIGS. 1 to 4. Therefore, an erase pulse is set to a reversed state of a write pulse according to the number of times of rewriting.

That is, as shown in FIG. 9, at an initial stage of rewriting, a voltage level of an erase pulse is low while being raised as the number of times of rewriting increases. Upper foot verify voltage VOP0 is set to a constant value, for example, 1.9 V, since read voltage VRW0 is at a constant voltage level (2.0 V), a threshold voltage in data holding is lowered. Therefore, a margin for upper foot voltage VOP0 and read voltage VRW0 is sufficient to be 0.1 V.

Similarly, since as the number of times of rewriting increases, erasure becomes harder, and accordingly, an erase start voltage (a first time erase pulse voltage) is made high when the erase pulse is applied in a pulse series.

Figure 10:
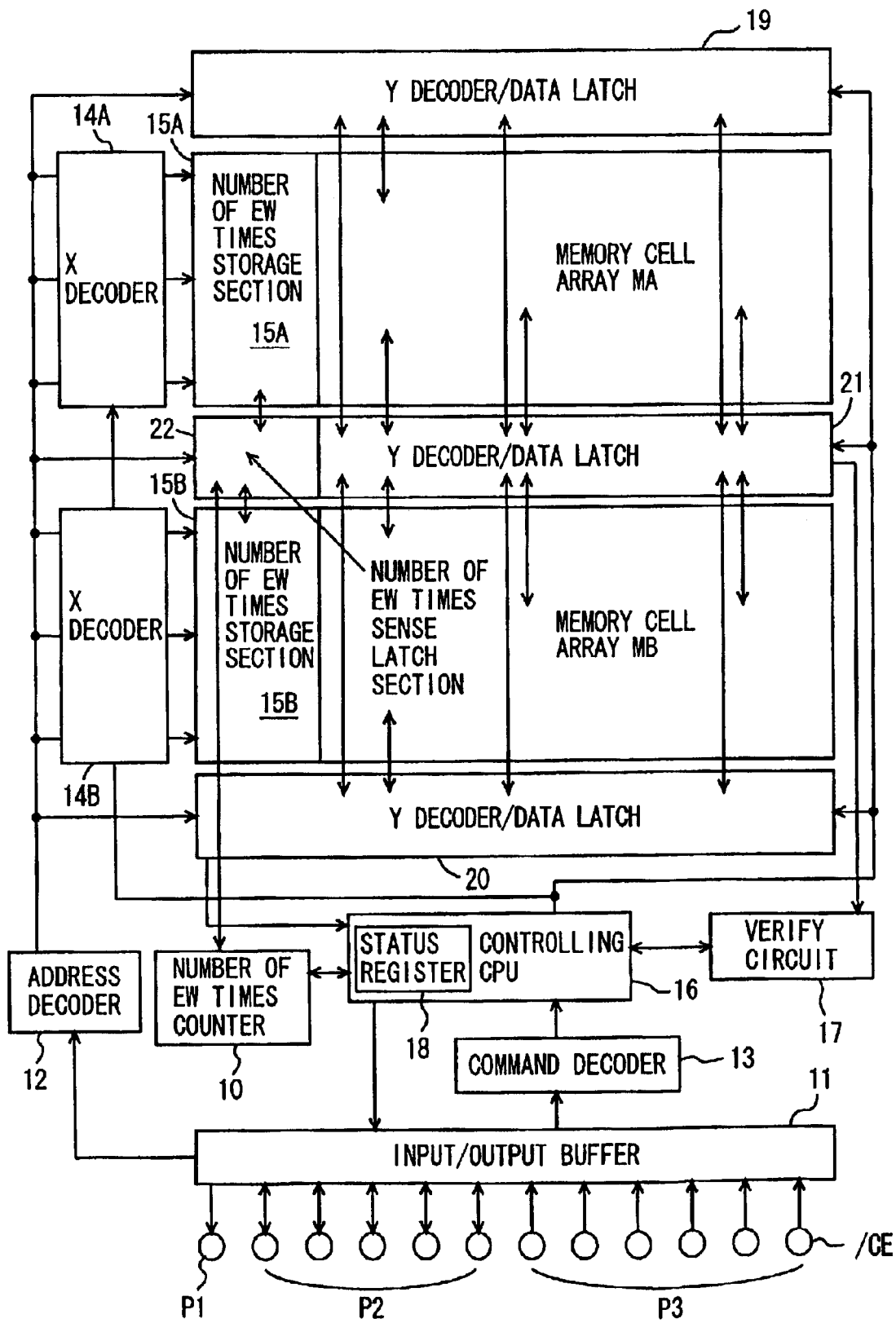
FIG. 10 is a diagram schematically showing an overall configuration of a non-volatile semiconductor memory device according to the first embodiment of the present invention.

FIG. 10 is a diagram schematically showing an overall configuration of a non-volatile semiconductor memory device according to the first embodiment of the present invention. In FIG. 10, a non-volatile semiconductor memory device 1 includes: a plurality of pin terminal groups P1 to P3 for supplying/receiving a signal/data externally; an input/output buffer 11 performing inputting/outputting of a signal/data externally through pin terminal groups P1 to P3; an address decoder 12 decoding an internal address signal applied from input/output buffer 11; a command decoder 13 decoding an internal control signal applied from input/output buffer 11 to issue a command instructing an operating mode; and memory cell arrays MA and MB each having a plurality of non-volatile memory cells arranged in rows and columns.

Pin terminal P1 outputs a ready/busy signal R/B indicating whether non-volatile semiconductor memory device 1 is in an operable state (a ready state) or non-volatile semiconductor device 1 is in operation (a busy state). Pin terminal group P2 includes bidirectional data input/output terminals inputting/outputting data. Pin terminal group P3 includes signal input terminals receiving external control signals controlling an internal operation. In FIG. 10, as an example of external control signal, there is shown typically a terminal receiving a chip enable signal /CE bringing the non-volatile semiconductor memory device into a selected state.

Figure 32:
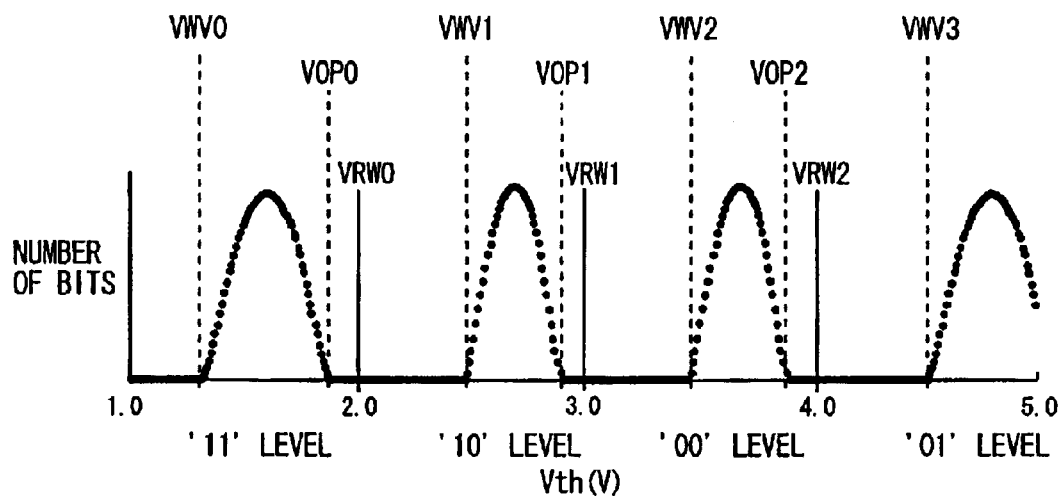
FIG. 32 is a graph showing an example of distribution of threshold voltages of a conventional multi-valued memory.
Figure 33:
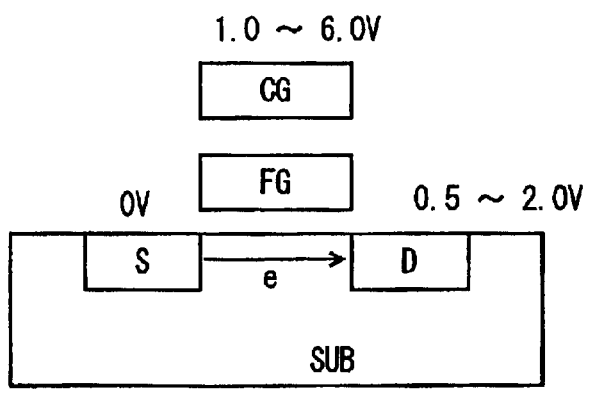
FIG. 33 is a diagram showing a construction of a conventional non-volatile memory cell and applied voltages in data reading.
Figure 34:
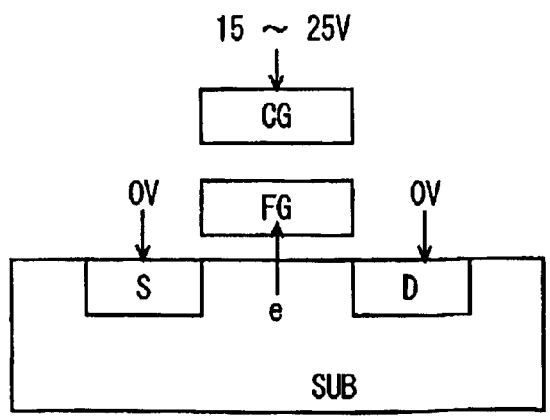
FIG. 34 is a diagram showing applied voltages in writing to a conventional non-volatile memory cell.
Figure 35:
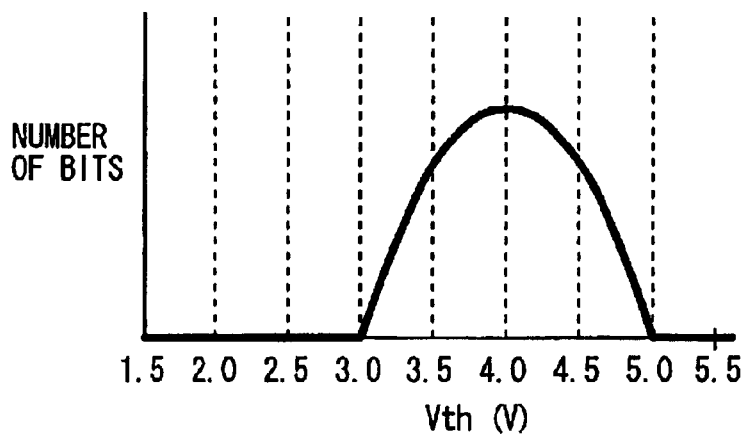
FIG. 35 is a graph showing an example of threshold distribution of a non-volatile memory cell.
Figure 36:
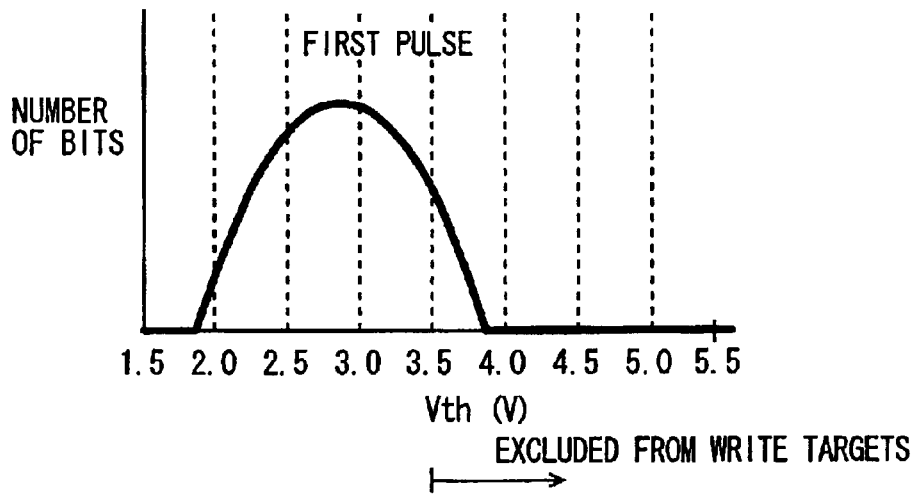
FIG. 36 is a graph showing a threshold voltage distribution after a write pulse is applied once.
Figure 37:
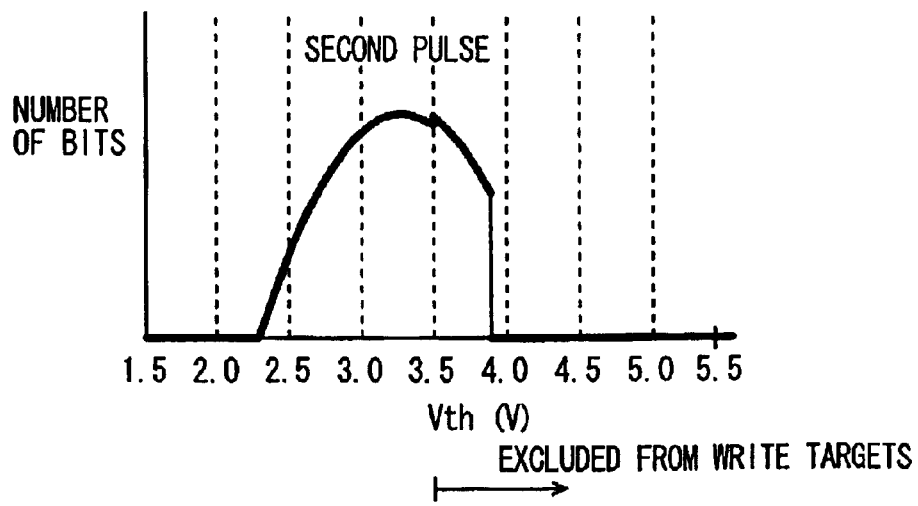
FIG. 37 is a graph showing a threshold voltage distribution after a write pulse is applied twice.
Figure 38:
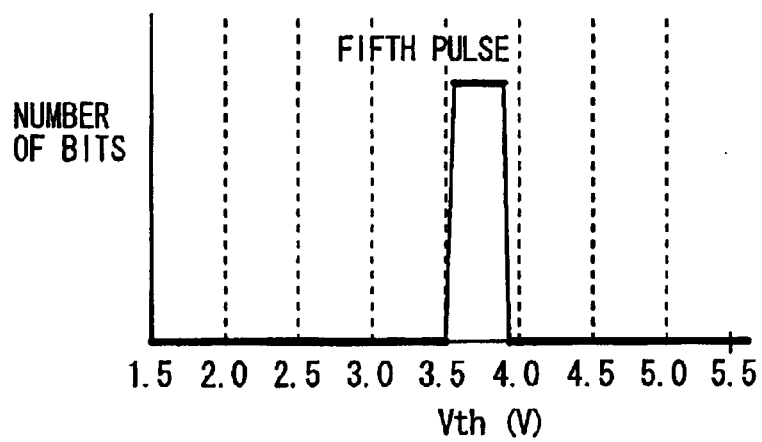
FIG. 38 is a graph showing a threshold voltage distribution after a write pulse is applied five times.
Figure 39:
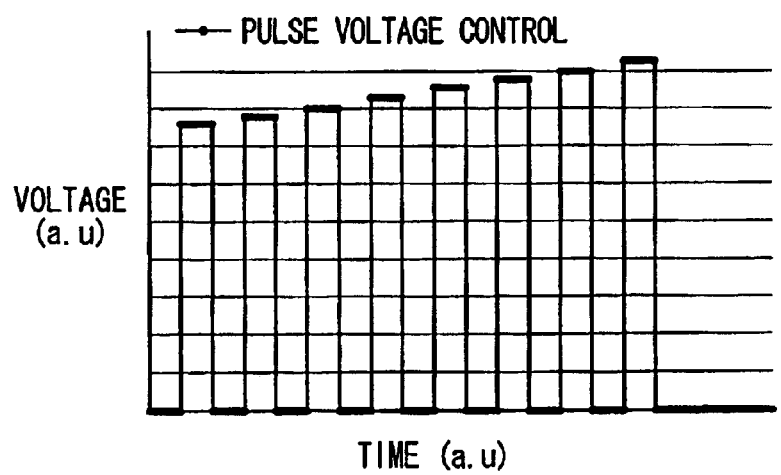
FIG. 39 is a graph showing a conventional write pulse sequence.
Figure 40:
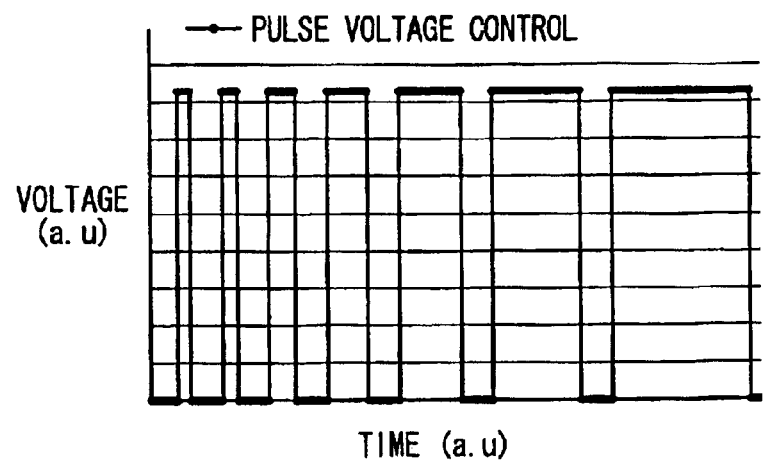
FIG. 40 is a graph showing another example of a conventional write pulse sequence.
Figure 41:
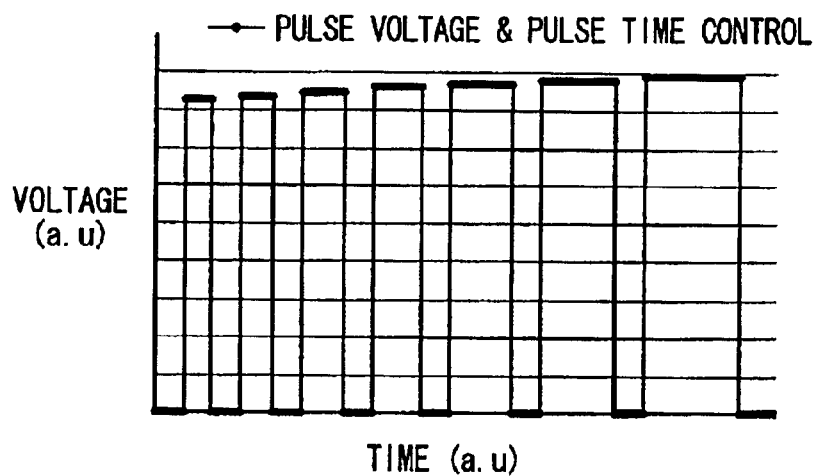
FIG. 41 is a graph showing still another example of a conventional write pulse series.
Figure 42:
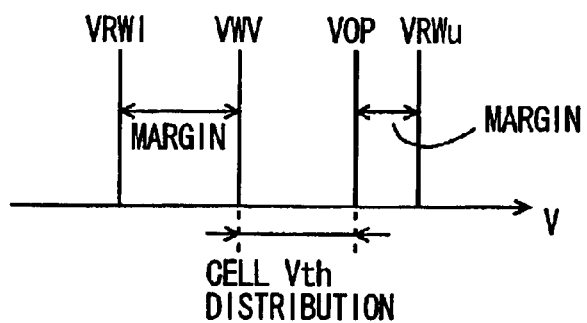
FIG. 42 is an illustration schematically showing a control width (a threshold voltage distribution region) of a non-volatile memory cell.
Figure 43:
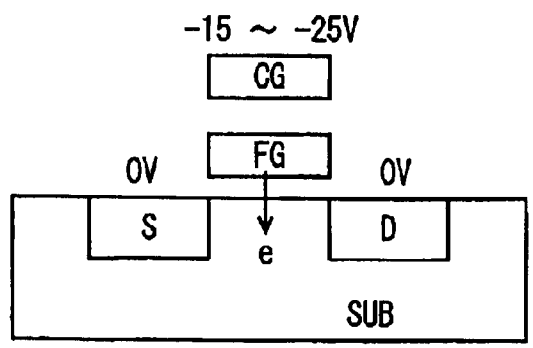
FIG. 43 is a diagram showing applied voltages in erasure of a conventional non-volatile memory cell.

Non-volatile memory cells included in memory cell arrays MA and MB store multi-valued data. As multi-valued data, there are used 2-bit data assuming 4 values of "01", "00", "10" and "11." A relationship between multi-valued data and a threshold voltage is the same as that previously shown in FIG. 32.

Non-volatile semiconductor memory 1 further includes: a controlling CPU 16 for controlling writing, reading and erasure of data and others; and a verify circuit 17 for controlling a verify operation performed when a rewrite operation including writing and erasure of data is performed.

Controlling CPU 16 includes a status register 18 for holding an internal status of non-volatile semiconductor memory device 1. Information held by status register 18 can be outputted externally. By use of controlling CPU 16 as a control circuit for controlling writing, reading, erasure and others, a rewrite operation including writing and erasure can be performed in a software manner to set complicate voltage levels and pulse width with flexibility.

A command designating an internal operation is set on the basis of signals applied through control pin terminal group P3 and data input/output terminal group P2.

Non-volatile semiconductor memory device 1 further includes: an X decoder 14A receiving an X address signal from address decoder 12 to select an addressed row of memory cell array MA; an X decoder 14B receiving an X address signal from address decoder 12 to select a designated row of memory cell array MB: a number of EW times storage section 15A provided for memory cell array MB; a number of EW times storage section 15B provided for memory cell array MB; a number of EW times counter 10 counting the number of times of rewriting under control of controlling CPU 16; a number of EW times sense latch section 22 reading and latching the number of times of rewriting stored in number of EW times storage sections 15A and 15B and bidirectionally transferring information on the number of times of rewriting to number of EW times counter 10; and a Y decoder/data latches 19, 20 and 21 operating according to a Y address signal from address decoder 12 and an output signal from controlling CPU 16.

Number of EW times storage sections 15A and 15B each store the number of times of rewriting of a rewrite unit (a sector or a page) in corresponding memory cell array MA or MB as detailed later.

The number of times of rewriting of addressed memory cells (a sector) is read out and latched by the number of EW times sense latch section 22 to be transferred to number of EW times counter 10. Number of EW times counter 10 transfers the applied information on the number of times of rewriting to controlling CPU 16 and controlling CPU 16 determines a set condition for a pulse necessary for rewriting according to the number of times of rewriting.

When rewriting is performed, a count value of number of EW times counter 10 is incremented by one to be set to a value indicating an actual number of rewriting times of selected memory cells. Data of the number of times of rewriting after update is transferred to the number of EW times sense latch section 22 prior to rewriting and stored into an original location of number of EW times storage section 15A or 15B in the rewriting to selected memory cells.

Number of EW times storage sections 15A and 15B are constructed of non-volatile memory cells similarly to a corresponding memory cell arrays, and rewriting to number of EW times storage section 15A or 15B is performed in parallel when data is rewritten in memory cell array MA or MB.

Figure 11:
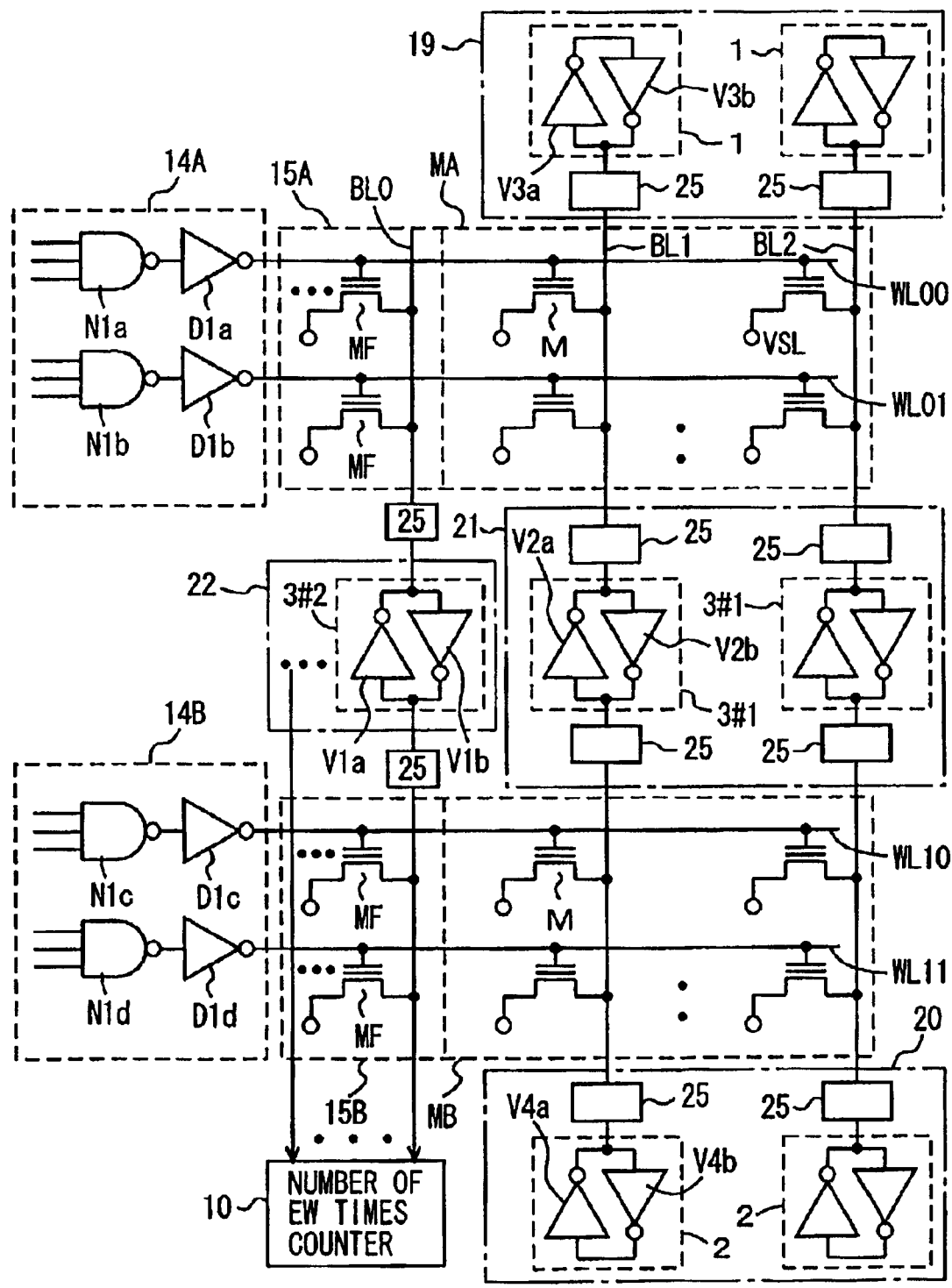
FIG. 11 is a diagram showing a specific configuration of a main part of the non-volatile semiconductor memory device according to the first embodiment of the present invention.

FIG. 11 is a diagram showing more specific configurations of memory cell arrays MA and MB, X decoders 14A and 15A, Y decoder/data latches 19, 20 and 21 and number of EW times sense latch section 22 shown in FIG. 10.

In FIG. 11, memory cell array MA includes: a plurality of non-volatile memory cells M arranged in rows and columns; word lines WL provided corresponding to respective non-volatile memory cell rows, and connecting non-volatile memory cells on corresponding rows; and bit liens BL provided corresponding to respective non-volatile memory cell columns, and connecting non-volatile memory cells on the corresponding columns. In FIG. 11, non-volatile memory cells M arranged in 2 rows and 2 columns in memory cell array MA are representatively shown. Therefore, word lines WL00 and WL01 are provided corresponding to the non-volatile memory cells on respective two rows and bit lines BL1 and BL2 are provided corresponding to the non-volatile memory cells arranged on respective two columns.

In memory cell array MB as well, non-volatile memory cells M are arranged in rows and columns, word lines WL are provided corresponding to the respective memory cell rows and bit lines are provided corresponding to the respective memory cell columns. In memory cell arrays MA and MB, bit lines BL are provided corresponding to memory cell columns commonly.

Non-volatile memory cell M is connected to a word line WL at the control gate thereof and to a bit line at the drain thereof, and receives a source voltage VSL at a source thereof.

X decoders 14a and 14b each have NAND circuit type decode circuits corresponding to the respective word lines. To word line WL00, there are provided a NAND circuit (decode circuit) N1a receiving an X address signal from address decoder 12 shown in FIG. 10 and a word line driver D1a inverting an output signal from NAND circuit N1a to drive word line WL00 to a selected state.

To word line WL01, there are provided a NAND circuit (decode circuit) N1b receiving an X address signal and a word line driver D1b inverting an output signal from NAND circuit N1b to drive word line WL01 to a selected state.

In X decoder 14b as well, a NAND circuit N1c and a word line driver D1c are provided corresponding to word line WL10, and a NAND circuit N1d and a word line driver D1d are provided corresponding to word line WL11.

Word line drivers D1a to D1d each set a voltage level of a corresponding selected word line under control of controlling CPU 16, in writing/erasure/reading.

Each of number of EW times storage sections 15A and 15B includes a plurality of non-volatile memory cells MF arranged so as to share corresponding rows with memory cells of memory cell arrays MA and MB. Memory cells of a plurality of bits are placed along the row direction in each of memory arrays MA and MB. However, in FIG. 11, for simplification of the drawing, non-volatile memory cells MF of one bit is representatively shown in each of the memory arrays MA and MB. Memory cells MF are placed so as to share a row with memory cells M and therefore, the number of EW times storage sections 15A ad 15B each store data indicating the number of times of rewriting to memory cells in units of sectors (or pages).

Y decoder/data latch 19 includes: data latches 1 provided corresponding to the respective bit lines; and signal processing circuits 25 provided corresponding to respective bit lines, and performing precharge/selective discharge and sensing of corresponding bit lines. Data latch 1 stores 1-bit data of 2-bit data on a corresponding bit line. Data latch 1 is constituted of a so-called inverter latch including inverters V3a and V3b.

Signal processing circuit 25 performs signal processing designated under control of controlling CPU 16 according to data stored in data latch 1.

Y decoder/data latch 20 similarly includes data latches 2 and signal processing circuits 25 provided corresponding to the respective bit lines of memory cell array MB. Data latch 2 has a configuration of an inverter latch including inverters V4a and V4b.

Y decoder/data latch 21 includes sense amplifiers 3#1 provided corresponding to the respective bit lines, and signal processing circuits 25 provided corresponding to the respective bit lines of memory cell arrays MA and MB.

Sense latch 3#1 includes inverters V2a and V2b. Sense latch 3#1 detects whether or not a current flows into a memory cell (bit line) when a read voltage (including a verify voltage) is applied onto a word line in a read operation and latches a result of the detection. Data latches 1 and 2 are used for saving the result read out by sense latch 3#1. Data latches 1 and 2 are provided for storing each bit of 2-bit data since memory cells M each store 2-bit data (4-valued data). Values stored in data latches 1 and 2 are finally outputted externally as read data in data reading mode.

In a write operation, write data is inputted to data latches 1 and 2, then data is applied to sense latch 3#1 bit by bit, and bit line voltage is set according to write data to selectively perform writing. Accordingly, a threshold voltage of the selected memory cell is determined corresponding to 4-valued data.

Number of EW times sense latch section 22 includes a sense latch 3#2 and signal processing circuit 25, both provided corresponding to a bit line provided in number of EW times storage sections 15A and 15B. Sense latch 3#2 is constituted of inverters V1a and V1b. Hereinafter, sense latch 3#2 included in number of EW times sense latch section 22 and sense latches 3#1 included in Y decoder/data latch 21 are collectively called sense latch 3.

In the configuration shown in FIG. 11, as to number of EW times storage sections 15A and 15B each, for simplification of the figure, there is shown a configuration of a number of EW times sense latch section for storing 2-valued data. In a case when 4-valued data is stored in the number of EW times storage section, similarly to the configuration of data latches 1 and 2 for memory cell arrays MA and MB, signal processing circuits 25 and latch circuits are provided on each side of bit line BL0 in the number of EW times storage sections 15A and 15B.

As shown in, for example, JP A 2001-210082, signal processing circuit 25 generates, in data reading, read data according to data latched in data latches 1 and 2 and sense latch 3#1, while in data writing, selectively setting the voltages on bit line to H level or L level according to write data stored in data latches 1 and 2 to selectively inhibit the data writing.

Figure 12:
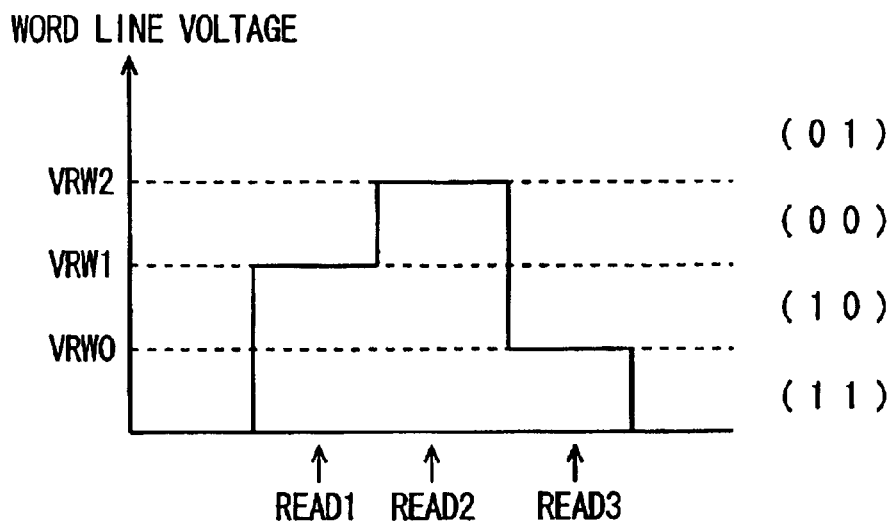
FIG. 12 is a graph showing a sequence of application of word line voltages in data reading in the non-volatile semiconductor memory device shown in FIGS. 10 and 11.

FIG. 12 is a diagram showing the voltages on a word line in data reading in a non-volatile semiconductor memory device according to the present invention. In reading of 4-valued data, since a threshold voltage is segmented into four regions, three read cycles READ1, READ2 and READ3 are performed for identifying the threshold voltage region. In read cycle READ1, a word line voltage is set to read voltage VRW1. In read cycle READ2, a word line voltage is set to read voltage VRW2. In read cycle READ3, a word line voltage is set to read voltage VRW0.

Data read out internally in read cycle READ1 is latched by sense latch 3. Data latched in sense latch 3#1 is inverted and transferred to data latch 2. Then, data again read out in read cycle READ2 is latched by sense latch 3#1. Data latched by sense latch 3#1 is transferred to data latch 1. Data read out in read cycle READ3 is latched into sense latch 3#1. It is determined whether or not data latched in data latch 1 and data latched in sense latch 3#1 coincide with each other, and a result of the determination is again stored into data latch 1.

Specifically, when data is read out in read cycle READ1, the upper bit of the data is 1 if a current flows, and is 0 if no current flows. When a bit line is set to read voltage level VRW1 to read data, data read out in read cycle READ1 and latched in sense latch 3#1 is equal to the inverted value of the upper bit. The inverted data is transferred to and latched in data latch 2. Therefore, the upper bit of read data is stored into data latch 2.

In a case when no current flows into a bit line in each of read cycles READ2 and READ3, data "01" is read out, and in a case when a current flows into a bit line in read cycle READ2 and no current flows in read cycle READ3, data "00" is read out. In a case when a current flows in both of read cycles READ2 and READ3, data "11" is read out. Therefore, if data bits (bit line voltages) read out in read cycles READ2 and READ3 are equal to each other, "1" is set, and otherwise, "0" is set. Accordingly, the lower bit value of 2-bit data is identified. The result of the determination is again transferred to and latched in data latch 1. Thereafter, by reading in parallel data of data latches 1 and 2, 2-bit data can be read.

In number of EW times sense latch section 22, in a case where 2-valued data is stored, read cycle READ1 is performed prior to erasure when a rewrite instruction is issued. Two-valued data is stored in memory cell MF of the number of EW times storage section and 2-valued data "1" is correlated with multi-valued data "11" and 2-valued data "0" with multi-valued data "01."

When 4-valued data is read out, in number of EW times sense latch section 22, an operation similar to an operation in data reading in a memory cell array is performed prior to an erase operation to read 4-valued data of number of EW times stored in number of EW times storage section 15a or 15B and to transfer the read out data to the number of EW times counter 10.

Figure 13:
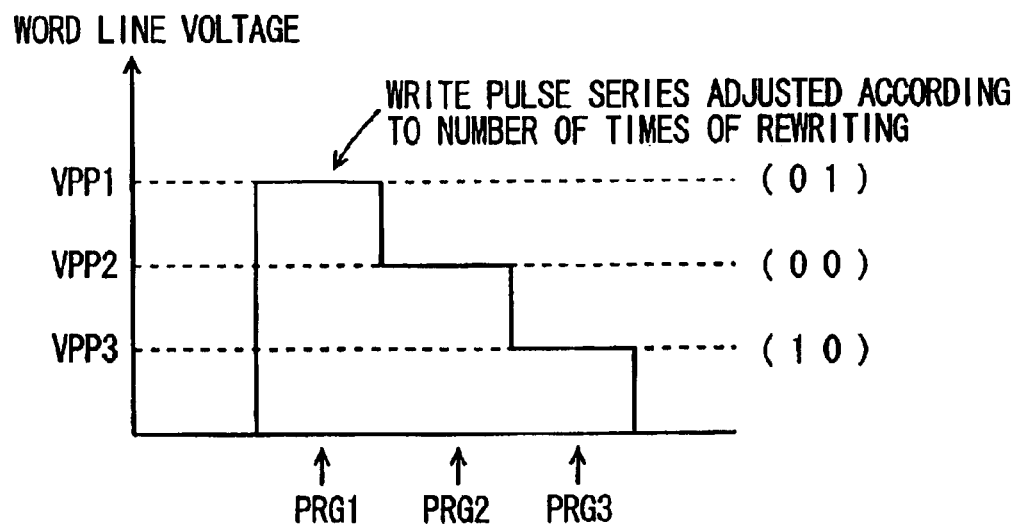
FIG. 13 is a graph schematically showing a sequence of application of word line voltages in data writing in the non-volatile semiconductor memory device shown in FIGS. 10 and 11.

FIG. 13 shows voltages on a word line in data writing. In writing, three write cycles PRG1, PRG2 and PRG3 are performed. In erasure, writing of data "11" is performed after completion of the erasure and the write cycles are performed after completion of the writing-back.

In write cycle PRG1, write voltage VPP1 is applied, in write cycle PRG2, write voltage VPP2 lower than write voltage VPP1 is applied to a word line and in write cycle PRG3, a write voltage VPP3 lower than write voltage VPP2 is applied to a word line.

Data "01", "00" and "10" are written to memory cells by write cycles PRG1, PRG2 and PRG3. In writing, a bit line is selectively charged and discharged according to latched data by sense latches 3#1 and 3#2 on the basis of data stored in data latches 1 and 2, to perform data writing. As for memory cells other than the write target, a bit line voltage is set to, for example, H level of 6 V to inhibit writing.

In a case of writing of 2-valued data, only write cycle PRG1 is performed in writing in each of number of EW times storage sections 15a and 15B.

In FIG. 13, write voltages VPP1 and VPP3, in writing, each have a voltage level of a write pulse adjusted according to the number of times of rewriting as shown in FIGS. 1 to 5.

In writing, data writing operations on respective data may performed sequentially in such a way that writing of data "01" is performed on memory cells of interest for data "01" to complete the data writing of data "01", then writing of the next data "00" is performed. In this case, voltages VPP1, VPP2 and VPP3 shown in FIG. 13 each are constituted of a write pulse series.

Alternatively, write voltages VPP1, VPP2 and VPP3 each may be formed of one write pulse. In this case, after execution of write cycles PRG1, PRG2 and PRG3, verify operations for selecting memory cells of write targets are successively performed for the respective data. Therefore, a waveform shown in FIG. 13 is applied with an altered pulse set condition till completion of the writing. The verify operations are executed in verify circuit 17 shown in FIG. 10.

Figure 14:
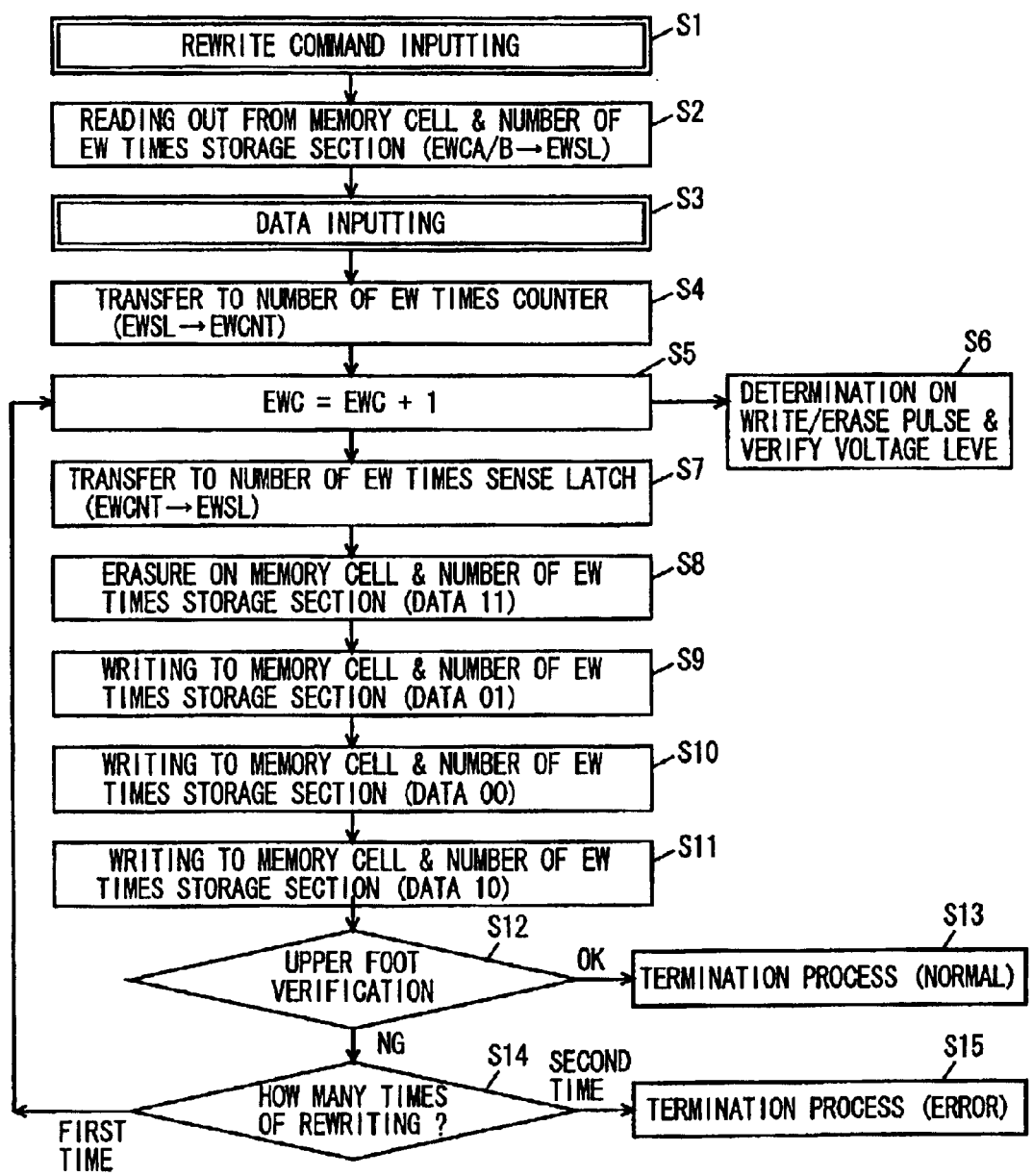
FIG. 14 is a flow chart representing an operation in data rewriting in a non-volatile semiconductor memory device according to the first embodiment of the present invention.

FIG. 14 is a flow chart showing operation in data rewriting in a non-volatile semiconductor memory device according to the first embodiment of the present invention. Description will be given of data rewrite operation with reference to FIGS. 10 and 14.

Firstly, a rewrite command instructing data rewriting is supplied externally together with an address signal (step S1). When such write command is applied, controlling CPU 16 activates address decoder 12 and X decoders 14A and 14B to select a word line corresponding to an addressed row in memory cell arrays MA and MB.

Two-valued or four-valued data of the number of rewriting times of selected memory cells (addressed memory cells) stored in an addressed memory cell and number of rewriting (EW) times storage sections 15A and 15B are read out according to the sequence shown in FIG. 12. Number of EW times data read out in the number of EW times storage sections (EWCA/B) 15A or 15B is latched in number of EW times sense latch section (EWSL) 22 (step S2).

Then, write data for rewriting is applied externally (step S3). Then, number of rewriting data latched in number of EW times sense latch section 3#2 is transferred to number of EW times counter (EWCNT) 10 (step S4).

Controlling CPU 16 increments number of rewritings (EWC) transferred to number of EW times counter 10 by one (step S5). Controlling CPU 16 sets a condition for a write pulse including a write pule and an erase pulse and for a verify voltage level according to the updated number of rewritings (step S6).

On the other hand, the number of times of rewriting incremented by one in number of EW times counter 10 is again transferred to and latched in number of EW times sense latch section 3#2 (step S7). Accordingly, prior to data rewriting, number of rewriting data updated by one is latched in number of EW times sense latch section 3#2. In parallel to transfer of number of rewriting times data from number of EW times counter 10, write data may be transferred to and latched into data latch through number of EW times sense latch section 3#1.

Subsequently, an erase operation is first performed for data rewriting and erasure is performed on stored data of a selected memory cell M and a corresponding memory cell MF in the number of EW times storage section. After completion of the erase operation, writing-back is performed and writing of data "11" is performed to the selected memory cells M and MF. When data "11" is written, a condition for a write pulse is updated and writing of data "11" is performed according the updated write pulse condition. When erasure is performed as well, a condition for the erase pulse is similarly updated according to a number of rewriting times.

Then, in steps S9 to S11, writing of write data "01", "00" and "10" are successively performed. At this time, writing to a corresponding memory cell MF of number of EW times storage section 15A or 15B is performed in parallel with writing of 4-valued data to the selected memory cell M. In a case where data of the number of rewriting times is 2-valued data, only write cycle PRG1 is performed in the number of EW times storage section. In writing of 2-valued data, by setting a bit line voltage of a number of EW times storage section to H level after completion of write cycle PRG1, subsequent writing can be inhibited. Alternatively, in a construction allowing writing of multi-valued data, by storing "1" into a data latch for storing the lower bit, 2-valued data can also be written when 4-valued data is written in the memory cell array.

In data writing, a bit line is selectively set to H level to inhibit writing of data and only a bit line of a write target is set at L level to enable writing according to write data latched in the data latch according to the processing by signal processing circuit 25. In write verify operation, when no current flows and a bit line voltage attains H level, the voltage of H level is latched by the sense latch to inhibit subsequent writing. Accordingly, a bit line of a memory cell of a write target is set to L level according to a stored data in the data latch to perform writing, thereby allowing selective writing according to write data. Write data is latched in the data latch and no transfer is performed between the sense latch and the data latch.

In writing, the following procedure is performed. When data "01" is written, according to the upper bit stored in data latch 2, a bit line associated with the upper bit being "1" is charged to H level. Then, the lower bit being "0" stored in data latch 1 causes an associated bit line to be discharged to ground voltage level. Only a bit line voltage corresponding to "01" turns L level, while the other bit lines attains H level to thereby inhibit writing.

In writing of data "00," a bit line associated with the upper bit being "1" is charged. Then, a bit line associated with the lower bit being "1" is charged to H level and a bit line with the lower bit being "0" is discharged to ground voltage level.

In writing of data "10," all the bit lines are charged to H level and then a bit line associated with the upper bit being "0" is maintained at H level. Then, a bit line associated with the lower bit being "1" is charged to H level and a bit line associated with the lower bit being "0" is discharged to ground voltage level.

In writing of data "11," a bit line associated with the upper bit being "0" is charged to H level and then a bit line associated with the lower bit being "0" is charged to H level.

In data writing, by latching a set bit line voltage as a write control voltage with sense latch 3, writing can be performed selectively.

When all bit line voltages are set to H level, writing is completed. Setting and detection of the bit line voltages are performed in the signal processing circuit. Alternatively, in write verification, bi-level reading of data may be executed according to a write verify voltage to detect a memory cell of a write target in the verify circuit.

Accordingly, in the flow chart shown in FIG. 14, it is shown that 4-valued data is written as number of rewriting times data in steps from S9 to S11. However, since binary data "0" and "1" corresponds to respective 4-valued data "01" and "11," as described above, binary data may be written, as number of rewriting times data, in this flow.

In writing, a verify operation using a write verify voltage on data is performed in each step of the flow chart shown in FIG. 14. In steps from S9 to S11, therefore, a write pulse series is generated for performing writing.

Then, on completion of data writing, it is determined whether or not data is correctly written according to inputted write data, using the upper foot verify voltage (step S12). At this time, in a number of EW times storage section as well, it is determined whether or not the number of rewriting times data is correctly written, on the basis of comparison between a count value of number of EW times counter 10 and the number of rewriting times data read out according to the verify voltage, in a similar manner irrespective of 4-valued data and binary data.

After the upper foot verify operation is all completed normally on all of write data and rewriting of data is completed normally, a rewrite finishing process is performed under control of controlling CPU 16 (step S13).

On the other hand, in step S12, in a case where in upper foot verify operation, a memory cell exceeding the upper foot verify voltage exists, it is determined what is this number of rewriting operation times (a number of upper foot verify operations) (step S14). The number of times of rewriting operation indicates a rewriting cycle number executed when one rewrite command is applied.

When the rewriting operation is at the first time, the process returns again to step S5 and a count value EWC of number of EW times counter 10 is incremented by one to set a condition for a write/erase pulse for the second time and to again perform erasure and writing of data. In a case where an upper foot verify condition is not met when the number of times of rewriting operation is 2, it is determined that correct data rewriting cannot be performed and an error termination process is executed by controlling CPU 16 (step S15).

Number of EW times storage sections 15a and 15B each are constituted of non-volatile memory cells similarly to memory cell arrays MA and MB and data is stored in a non-volatile manner. Therefore, even if power supply to the non-volatile semiconductor memory device is cut off, a number of times of rewriting are reliably retained.

In a system using the non-volatile semiconductor memory device, there is a case where a request arises of grasping the number of times of rewriting. A count of number of EW times counter 10 may be configured to be outputted externally through a specific input/output pin so that such a request can be met.

When a memory cell region, which is a write target, is rewritten beyond a guaranteed number of times of rewriting, a status error may be configured to be outputted externally without actually performing rewriting of data. This construction can be easily implemented through comparison of a count of a number of EW times counter with a guaranteed number of times of rewriting.

Note that number of EW times counter 10 may be constituted of a counter that can be initialized with the number of EW times transferred from number of EW times sense latch section 22, and has a count value incremented by one under control of controlling CPU 16. Alternatively, the number of EW times counter 10 may be a normal register. In this case, controlling CPU 16 performs processing of incrementing the count of the counter by one internally to store a result of the processing in the counter register.

According to the first embodiment of the present invention, as described above, a rewrite pulse condition for writing/erasure is altered according to the number of times of rewriting of a memory cell. Thus, a margin corresponding to the number of times of rewriting can be set and the number of times of application of a rewrite pulse can be reduced, to reduce a rewrite time. Furthermore, due to the reduction in the number of times of application of a rewrite pulse, degradation in characteristics of a memory cell can be suppressed and a highly reliable non-volatile semiconductor memory device can be achieved.

[Second Embodiment]

FIGS. 15 to 19 are graphs showing write pulse strings set in a non-volatile semiconductor memory device according to a second embodiment of the present invention. In the second embodiment, a write pulse width increase rate $\beta$ is varied instead of a change in voltage increment width of a write pulse. Moreover, a pulse width of a write start pulse applied at the first rewrite operation is altered instead of a change in voltage level of the write start voltage.

Figure 15:
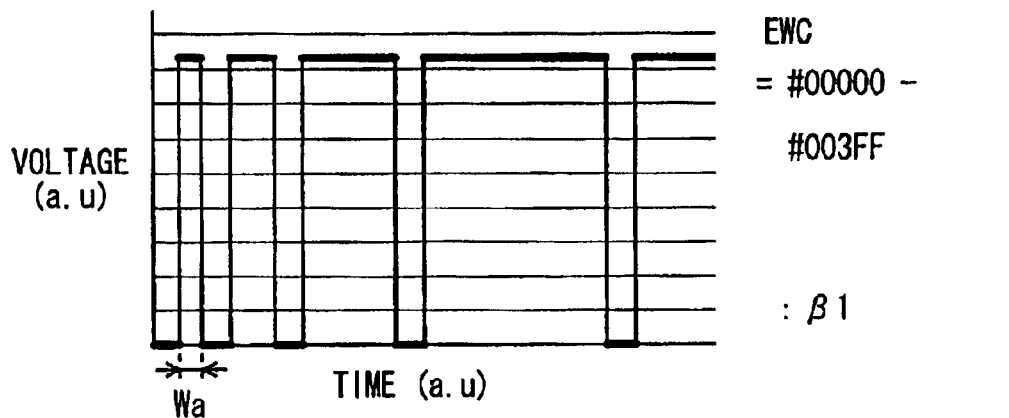

That is, as shown in FIG. 15, when the number of rewriting count value EWC is #00000 to #003FF (to the 1023-rd rewriting from the first rewriting), the write pulses are generated with a write start pulse (the first write pulse) having a pulse width of Wa and with a pulse width increase rate set to $\beta 1$. A voltage level of the write pulse is at a constant value. In a case where a pule width is altered, since writing is performed successively on a slower memory cell, a pulse width in a pulse series is successively is set greater within one rewrite operation. Thereby, at an initial stage of rewriting, writing to a memory cell slow in writing can be completed in a small number of times of verify operation.

Figure 16:
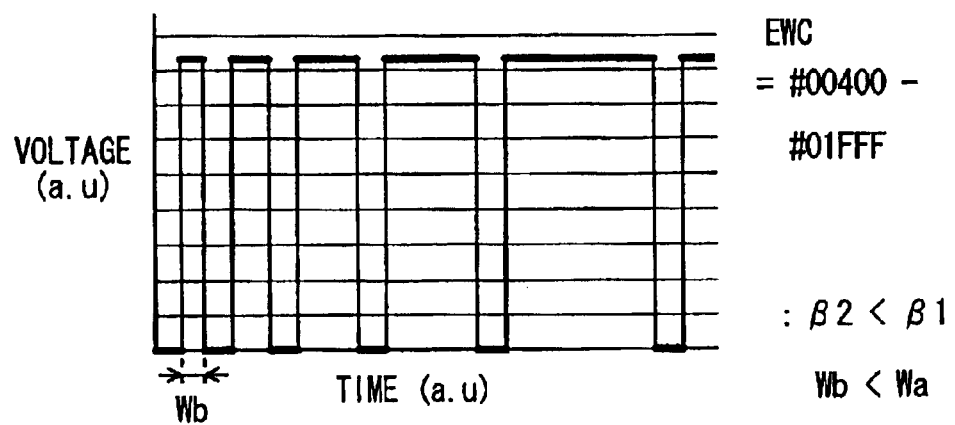

Referring to FIG. 16, when the number of rewriting count value EWC is in the range of from #00400 to #01FFF (in a region from the 1024-th rewriting to the 8191-st rewriting), a pulse width increase rate of the write pulse is set to $\beta 2$ smaller than $\beta 1$. Furthermore, a pulse width of a write start pulse is set to Wb and the write pulse width of the write start pulse is made narrower as write characteristics becomes faster.

Figure 17:
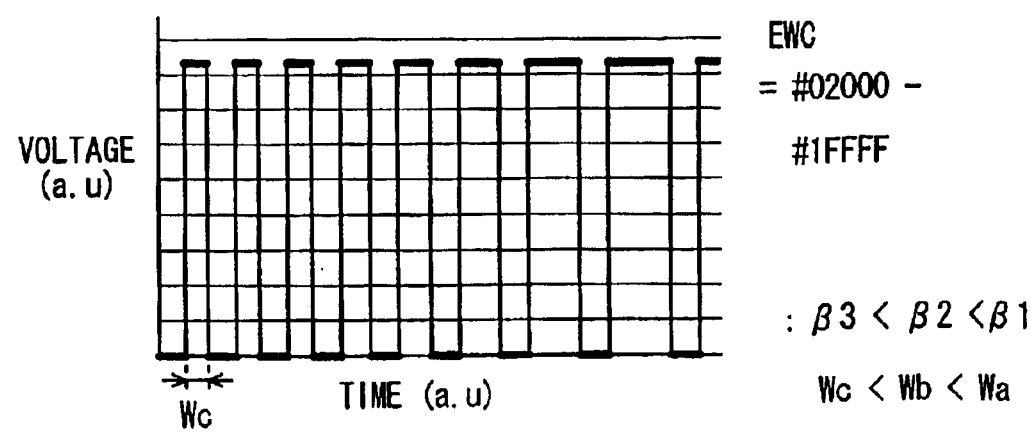

Referring to FIG. 17, when the number of rewriting times count value EWC is in the range from #02000 to #1FFFF (in a region from the 8192nd rewriting to the 131071st rewriting), a write start pulse width in rewriting is set to a further smaller Wc. Moreover, an increase ratio of the pulse width is set to a further smaller $\beta 3$.

Referring to FIG. 18, when the number of rewriting times count value EWC is in the range of #20000 to #3FFFF (in a region of the 131072nd rewriting to the 262143rd rewriting), write characteristics of a memory cell is further faster, so that a write start pulse width is set to a still further smaller Wd. The pulse width increase rate is the same as the case when the number of rewriting times count value EWC is in the range of #02000 to #1FFFF.

Referring to FIG. 19, when the number of rewriting count value EWC is in the range of #40000 to #FFFFF (in a region of the 262144th rewriting to the 1048575th rewriting), the write start pulse width is set to a yet further smaller We. The pulse width increase rate is the same as $\beta 3$.

Note that in the write sequences shown in FIGS. 15 to 19, as for a change rate of an erase pulse width in erasure performed prior to writing as well, as shown in FIG. 20, the change rate is increased successively with increase of the number of times of rewritings. An erase start pulse width is wider successively with increase in number of times of rewriting since erasure becomes slower. A change in erase pulse is accordingly expressed by the patterns in the order from FIG. 19 to FIG. 15.

A verify voltage is similar to that in the first embodiment and a width of a threshold voltage distribution is set in a similar manner to the first embodiment.

Note that in a generation sequence of write pulses shown in FIGS. 15 to 19, a pulse width increase rate is set to $\beta 3$ in operations at the 8192nd et. seq. rewritings. This is because in the first embodiment, a voltage level of a write pulse reaches a value corresponding to the maximum guaranteed number of rewritings (one million times of rewriting) at the 8192nd et. seq. rewriting. In this case, however, the write pulse width increase rate $\beta$ may be different for the respective regions starting at the 8192nd rewriting and subsequent rewritings.

In erasure, it is identified after application of an erase pulse whether or not erasure is performed according to whether or not a threshold voltage of each of all memory cells of the write targets is equal to or lower than upper foot verify voltage VOP0 for data "11."

An operation sequence of data rewriting in the second embodiment is the same as that in the operating flow shown in FIG. 14, which is described in the first embodiment. In determination on conditions of a write/erase pulse in step S6, a pulse width change rate and an initial write pulse width are determined and set.

Note that the pulse width increase rate and a change amount in level of the write pulse voltage may be both altered. That is, the first embodiment and the second embodiment may be combined and as the number of times of rewriting increases, a voltage increase width of the write pulse is decreased and a change rate of a pulse width of the write pulse is made smaller.

According to the second embodiment of the present invention, as described above, a pulse width change rate of the rewrite pulse for performing writing/erasure is set according to the number of times of rewriting and a pulse width of the write start pulse is also altered according to the number of times of rewriting. Writing corresponding to memory cell characteristics and further reduction in rewrite time can be achieved.

[Third Embodiment]

Figure 21:
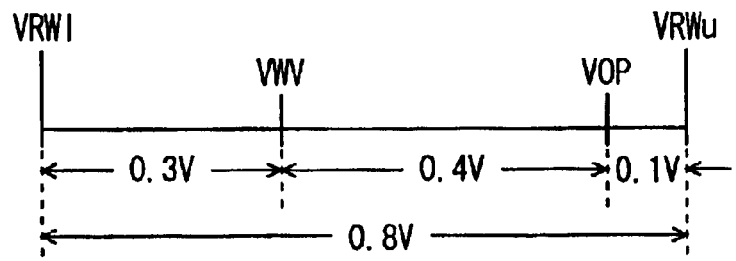
FIG. 21 is an illustration showing a control width (a threshold voltage distribution region) according to a third embodiment of the present invention.
Figure 22:
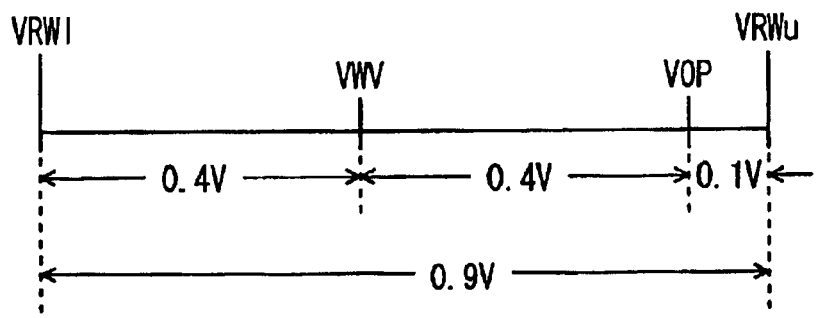
FIGS. 22 and 23 are illustrations showing control widths according to the third embodiments of the present invention.
Figure 23:
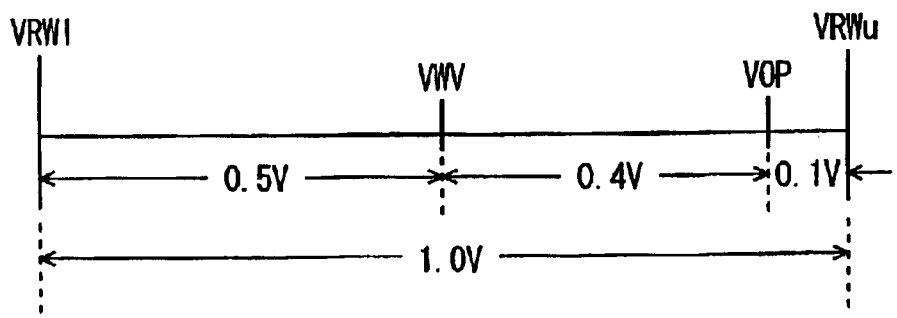

FIGS. 21 to 23 show set read windows for a non-volatile semiconductor memory device according to a third embodiment of the present invention.

Referring to FIG. 21, at an initial stage of rewriting where the number of rewriting times count value EWC is in the range from #00000 to #003FF, a threshold voltage changes only by the order of 0.1 to 0.2 V even after data is held. Accordingly, a voltage difference between write verify voltage VWV and lower side read voltage VRW1 is set to 0.3 V in consideration of a margin for variations in power supply voltage and temperature. A control region width between write verify voltage VWV and upper foot verify voltage VOP is set to 0.4 V. A voltage difference between upper foot verify voltage VOP and upper side read data VRWu is set to 0.1 V. Accordingly, a voltage difference between read voltages VRWu and VRW1 (a read window) is 0.8 V.

Even with a voltage difference between read voltages VRWu and VRW1 (read window) being 0.8 V, a sufficient margin can be ensured at an initial stage of rewriting.

Referring to FIG. 22, when the number of rewriting times count value EWC is in the range of #00400 to #01FFF, a threshold voltage changes by 0.2 V to 0.3V after data is held. Therefore, as shown in FIG. 22, a voltage difference between lower side read data VRW1 and write verify voltage VWV is set to 0.4 V. A voltage difference between write verify voltage VWV and upper foot verify voltage VOP is 0.4 V and therefore, a control width of a threshold voltage is constant. A voltage difference between upper foot verify voltage VOP and upper side read voltage VRWu is set to 0.1 V.

Accordingly, in this case, a read window has a width of 0.9 V.

When the number of rewriting times count value EWC is #02000 or greater, a threshold voltage after data is held changes by 0.4 V or so. Therefore, as shown in FIG. 23, a voltage difference between write verify voltage VWV and lower side read voltage VRW1 is set to 0.5 V. A voltage difference between write verify voltage VWV and upper foot verify voltage VOP is 0.4 V and a voltage difference between upper side read voltage VRWu and upper foot verify voltage VOP is 0.1 V. Accordingly, a read window is 1.0 V in width.

A distribution region of threshold voltages, or a control width, is maintained at a constant value of 0.4 V regardless of the number of times of rewriting. By decreasing a read window width at an initial stage of rewriting, a shift amount in threshold voltage by rewriting can be reduced and the number of times of application of a write pulse (the number of verify operations) in data rewriting can be reduced. Furthermore, damage to a tunnel insulating film of a memory cell can be reduced, thereby achieving an increased lifetime.

Figure 24:
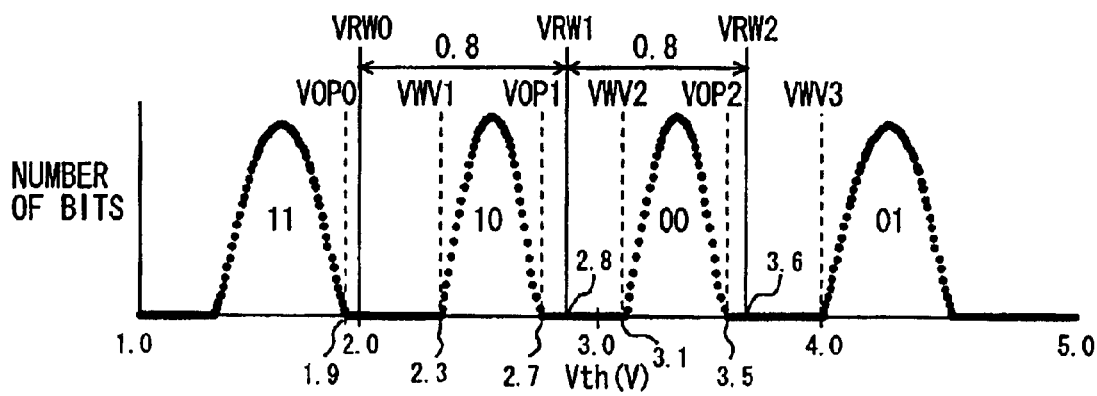
FIGS. 24 to 26 are graphs each showing an example of a read window according to the third embodiment of the present invention.
Figure 25:
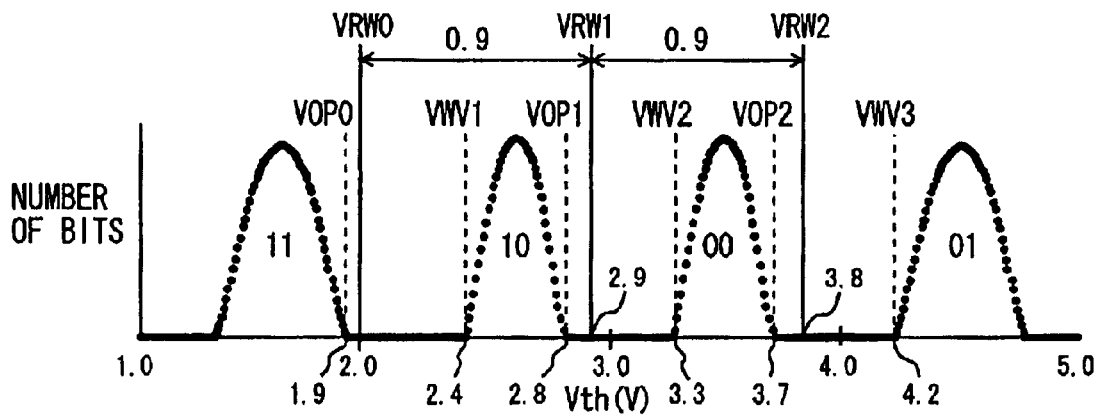
Figure 26:
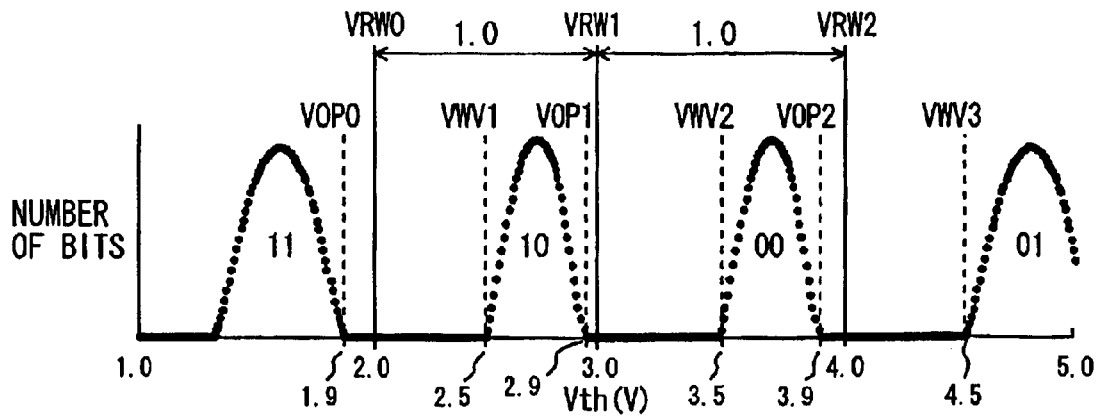

FIGS. 24 to 26 are graphs each showing a threshold voltage distribution and read voltages according to the third embodiment of the present invention.

Referring to FIG. 24, when the number of rewriting times count value EWC is in the range of #00000 to #003FF, read voltages VRW0, VRW1 and VRW2 are set to 2.0 V, 2.8 V and 3.6, respectively. Upper foot verify voltages VOP0, VOP1 and VOP2 are set to 1.9 V, 2.7 V and 3.5 V, respectively. Write verify voltages VWV1, VWV2 and VWV3 are set to 2.3V, 3.1 V and 4.0 V, respectively.

Accordingly, at an initial stage of rewriting, read windows for data "10" and "00" each have a width of 0.8V. A voltage difference between lower side read voltage and write verify voltage is 0.3 V.

Next, referring to FIG. 25, when the number of rewriting times count value EWC is in the range of #00400 to #01FFF, read voltages VRW0, VRW1 and VRW2 are set to 2.0 V, 2.9 V and 3.8 V, respectively. Upper foot verify voltages VOP0, VOP1 and VOP2 are set to 1.9 V, 2.8 V and 3.7 V, respectively. Write verify voltages VWV1, VWV2 and VWV3 are set to 2.4 V, 3.3 V and 4.2 V, respectively.

Accordingly, in this case, a read window is 0.9 V in width and a difference between write verify voltage and lower side read voltage is 0.4 V.

Referring to FIG. 26, when the number of rewriting times count value EWC is #02000 or greater, read voltages VRW0, VRW1 and VRW2 are set to 2.0 V, 3.0 V and 4.0 V, respectively. Upper foot verify voltages VOP0, VOP1 and VOP2 are set to 1.9 V, 2.9 V and 3.9V. Write verify voltages VWV1, VWV2 and VWV3 are set to 2.5 V, 3.5 V and 4.5.

Accordingly, in this case, a read window is 1.0 V in width and a difference between write verify voltage and lower side read voltage is 0.5 V.

Note that as shown in FIGS. 24 to 26, as the number of times of rewriting increases, a threshold voltage distribution region is caused to shift to higher values and a width of a read window is changed according to an increased threshold voltage of a memory cell depending on an increased number of times of rewriting. The number of times of application of the write pulse can be set to an optimal value according to a threshold voltage distribution changing with an increased number of times of rewriting.

In a case of a small number of times of rewriting, a change amount in threshold voltage caused by data rewriting is reduced. Thus, the number of times of application of the write pulse for shifting the threshold voltages in data rewriting can be reduced, thereby ensuring reliability of the tunnel insulating film of a memory cell.

Note that in threshold voltage distributions shown in FIGS. 24 to 26, voltage levels of read voltages VRW1 and VRW2 and a verify voltage are set on the basis of read voltage VRW0. Therefore, setting of each voltage level can be easy and furthermore, correct data reading can be ensured. This is because in a case where all of the voltage levels are changed according to the number of times of rewriting, there arises a possibility that for example, for data "11" and data "01," a threshold voltage distribution region may not be set to 0.4 V or higher.

Moreover, the number of times of rewriting has to be read prior to setting of the read voltages. In reading number of rewriting times data, the number of times of rewriting of a selected memory cell can not be predicted. Therefore, in order to read correct data of the number of times of rewriting irrespective of the number of times of rewriting, number of rewriting times data is stored in a binary data form, and a voltage level for a binary determination criterion is set to a constant value regardless of the number of times of rewriting. Number of rewriting times data can be read correctly regardless of the number of times of rewriting to set a read window according to the number of times of rewriting, and reading of data and rewriting of data can be performed correctly.

Note that either of read voltages VRW1 and VRW2 may be used as a voltage set for reading a correct number of times of rewriting and as a reference voltage for setting the other voltages.

Note that while write verify voltage VWV0 for data "11" is not shown in FIGS. 24 to 26, such voltage may be set to 1.5 V or alternatively, similarly to a conventional case, may be set to 1.3 V. A control width of a threshold voltage for data "11" may be set to 0.6 V, or alternatively, to another voltage level.

In the data rewrite operation flow in the third embodiment as well, similarly to the flow shown in FIG. 14, in the step S6 of determination a condition for a write/erase pulse, setting of a verify voltage level is performed. In reading of number of EW times storage data in step S2 shown in FIG. 14, the number of times of rewriting information is needed to be read under a state where the number of times of rewriting of a selected memory cell is indefinite. Hence, one of reading voltages is set to a constant value and binary data stored in the number of EW times storage section is read out according to the voltage set to the constant value. That is, for a configuration in which a read widow is altered, number of rewriting times data stored in number of EW times storage sections 15a and 15B are preferably binary data.

Figure 27:
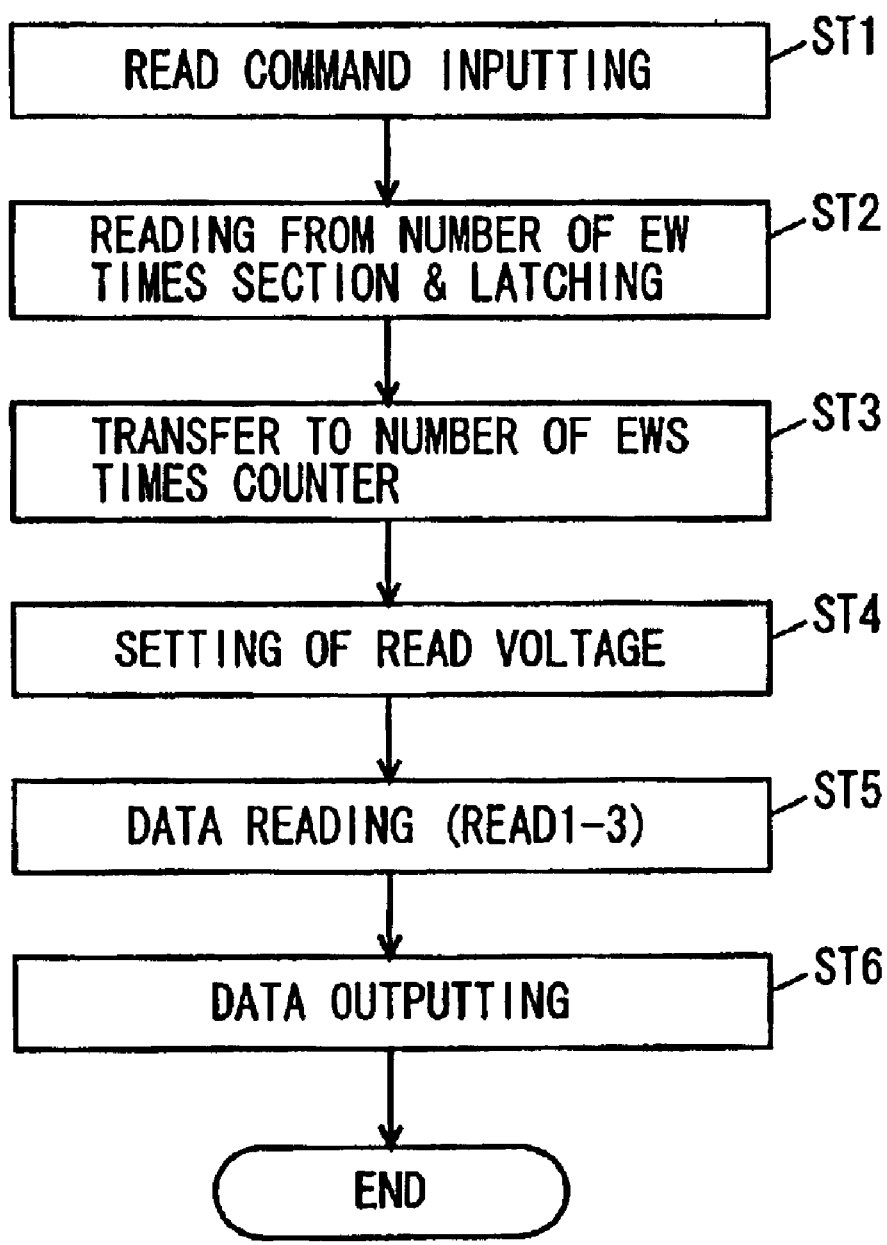
FIG. 27 is a flow chart representing an operation in data reading of a non-volatile semiconductor memory device according to the third embodiment of the present invention.

FIG. 27 is a flow chart showing an operation in data reading in the third embodiment of the present invention. Referring to FIG. 27, description will be given of data read operation in the third embodiment of the present invention below.

A read command instructing data reading is applied externally (step ST1). When the read command is applied, storage data of the number of EW times storage section is read out according to an address signal under control of controlling CPU 16 and latched by the number of EW times sense latch section (step ST2). In reading of the number of rewriting times data in the number of EW times storage section, read voltage VRW0 is used in a case where read window distributions shown in FIGS. 24 to 26 are employed. Thereby, the number of rewriting times data expressed by binary data can be read out and latched in the number of EW times sense latch section.

Then, the number of rewriting times data latched in number of EW times sense latch section #32 is transferred to number of EW times count section 10 (step ST3). Controlling CPU 16 sets a voltage of a read voltage according to number of rewriting times data stored in number of EW times counter 10 (step ST4). In data reading, there is no need to update a count value of number of EW times counter 10.

Next, internal data reading (read cycles from READ1 to READ3) is performed according to the set read voltages (step ST5).

Then, 4-valued data read out internally is converted to binary data and outputted externally (step ST6).

Therefore, when a read command is applied, by reading the number of rewriting times data stored in the number of EW times storage section, the number of times of rewriting of a addressed memory cell can be identified correctly to set the voltage levels of the read voltages.

According to the third embodiment, as described above, a width and position of a read window is altered according to the number of times of rewriting. In addition, in a case where the number of times of rewriting is smaller, a shift amount in threshold voltage caused by data rewriting can be smaller, so that damage to a gate tunnel insulating film due to a write pulse can be suppressed. Furthermore, with increase in number of times of rewriting, a position of a read window is set higher, thereby enabling setting of an optimal threshold voltage distribution region according to characteristics of a memory cell.

Note that in this third embodiment, conditions of the erase pulse are altered according to the number of times of rewriting. A threshold voltage distribution region is altered according to the number of times of rewriting. The conditions of a width and voltage level of a write pulse may be set constant irrespective to the number of times of rewriting, and alternatively, may be altered according to the number of times of rewriting in accordance with the method of the first or second embodiment.

[Fourth Embodiment]

FIG. 28 is a flow chart showing operation in data rewriting according to a fourth embodiment of the present invention. In data rewriting operation shown in FIG. 28, steps S1 to S11 similar to those in data rewrite operation shown in FIG. 14 are performed first.

In the operation flow shown in FIG. 14, a data rewrite operation is again performed, if write failure is determined when an upper foot verification is performed in step S10 after data writing and if the data rewriting operation is the first time operation. In the operation flow shown in FIG. 28, however, when the upper foot edge verification is performed in step S10 and it is determined that writing failure occurs, the number of rewriting times count value EWC after update, latched in number of EW times counter 10, is updated by 2 or greater. In FIG. 28, there is shown a case where number of EW times count value EWC is set to be doubled in step S20, as an example.

That is, when as a result of the upper foot verification performed in step S10, writing failure is detected, a threshold voltage of a memory cell is at a voltage level higher than the upper foot verify voltage. Accordingly, it can be considered that write characteristics of the memory cell turn faster. That is, in a case where defective writing occurs in the first rewriting operation, the possibility that current writing/erasure control is insufficient is high. Therefore, rewriting is performed with the number of times of rewriting further increased.

That is, in step S20, number of EW times count value EWC of the number of rewriting times counter is further incremented by a prescribed count of two or greater (in this embodiment, a count value is doubled). Controlling CPU 16 shown in FIG. 10 again determines and sets a write/erase pulse according to the updated number of rewriting times data (step S21).

The updated number of rewriting times data is transferred to number of EW times sense latches (EWSL) 15A and 15B from the number of EW times counter (EWCNT) (step ST22). Subsequently, in step S21, an memory cell and a number of EW times storage section are erased according to a newly set write/erase pulse and then "11" is written (step ST23).

Next, data is written to a memory cell and a number of EW times storage section according to input data applied in step S23 and to number of rewriting times data transferred to and latched in the number of EW times sense latch (step ST24).

After writing is completed, the upper foot verify operation is again performed (step S25). If it is determined that writing is normally performed, by the upper foot verification, then a process for terminating rewriting of data is executed (step S26).

On the other hand, in step S25, if as a result of the upper foot verify operation, writing is determined defective, a terminating process for error is performed (step S27). In the error terminating process, for example, a flag indicating externally that data writing could not be performed is applied to a processor of the system.

Update of a count value EWC of the number of EW times counter in step S20 is performed under control of controlling CPU 16. In this case, the number of EW times counter may be configured of a register and an adder, to add the number of rewriting count value EWC stored in the register with the adder.

In steps S6 and S11, a read window may be altered in a similar manner to the third embodiment.

According to the fourth embodiment of the present invention, as described above, when defective writing is detected in an upper foot verify operation, a rewrite condition is updated and writing is repeated. When write control is insufficient, fast and more precise write control can be performed to write data.

Note that an operating flow may be such that rewriting is allowed to be repeated twice at most and in the first time rewriting, processing is performed according to the flow show in FIG. 14 and in the second time rewriting, processing from step S20 et. seq. is performed. In this case, in the second time rewriting, number of EW times count value EWC is set to be, for example, 4 times.

[Fifth Embodiment]

Figure 29:
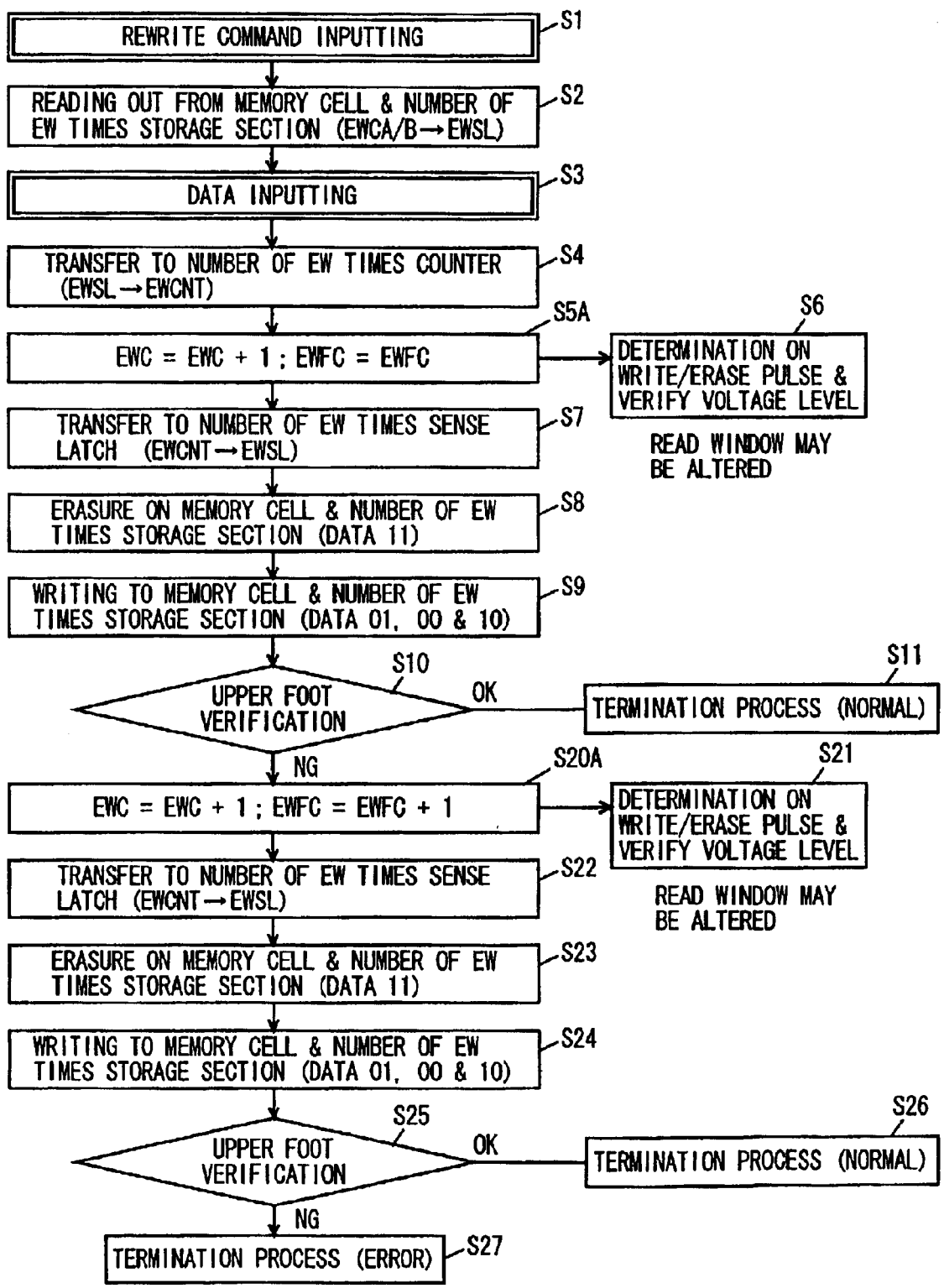
FIG. 29 is a flow chart representing an operation in data rewriting of a non-volatile semiconductor memory device according to a fifth embodiment of the present invention.

FIG. 29 is a flow chart showing an operation in data rewriting of a non-volatile semiconductor memory device according to a fifth embodiment of the present invention. In the fifth embodiment, there is provided a number of rewriting failure count circuit for counting the number of times of rewriting failures when rewriting failure is detected as a result of an upper foot verification. A condition for a write/erase pulse (a rewrite pulse) is determined according to a count value EWFC of the number of rewriting failure count circuit and a count value EWC of the number of rewriting times counter.

That is, in the flow chart shown in FIG. 29, a step S5A is performed instead of step S5 shown in FIG. 28 and furthermore, a step S20A is performed instead of step s20 shown in FIG. 28.

In step S5A shown in FIG. 29, a count value EWC of the number of times of rewriting counter is incremented by one. At this time, a count value of EWFC of the number of rewriting failure count circuit is not updated. A condition for a write/erase pule (a rewrite pulse) is determined according to rewriting count value EWC and the number of rewriting failure count value EWFC.

When in step S10, an upper foot verification is performed and it is determined to be a rewriting failure, the step S20A is performed in stead of step S20 shown in FIG. 28. In step S20A, a count value of EWC of the EW times counter is incremented by one and a count value of EWFC of the number of rewrite failure count circuit is incremented by one. A condition for a write/erase pulse in execution of re-rewriting is determined according to the count values EWC and EWFC.

Other steps are the same as process steps shown in FIG. 28, corresponding steps in both flows are attached with the same step numbers and the description thereof will not repeated.

In the fifth embodiment, as the number of times an error (rewriting failure) occurs once in rewriting is increased, it is determined that the non-volatile semiconductor memory device is brought into greater tendency to exceed an upper foot verify voltage and a condition for a rewrite pulse (a write/erase pulse) is set in consideration of not only rewriting count value EWC but also rewrite failure count value EWFC.

Note that in the flow chart shown in FIG. 29 as well, a read window may be altered in steps S6 and S11.

FIG. 30 is a table showing, in a list form, the number of rewriting times count values EWC, the number of rewrite failure times count values EWFC and set conditions for a write/erase pulse.

In cells of the table of FIG. 30, there are shown three kinds of voltages with symbols "/" inserted in between. In each cell, a voltage in the left side indicates a write verify voltage, a voltage in the middle indicates a write start voltage, and a voltage in the right side indicates a control width (a threshold voltage distribution width or a shift amount in threshold voltage per one time).

In a case where the number of rewrite failure times count value EWFC in the first rewriting is from 0 to 3 times, a write verify voltage, a write start voltage and a control width are set according to each number of times of rewriting (number of EW times) in a similar manner to the first embodiment.

When the number of rewrite failure times count value EWFC is from 4 to 7, it is determined that under a ordinary rewrite control, an upper foot voltage is exceeded in many cases and a write start voltage is reduced by 0.1 V in each number of times of rewriting. Furthermore, a threshold distribution width (control width) as well is narrowed by 0.1 V. A level of a write verify voltage is the same as in the case where the number of rewrite failure times count value EWFC is from 0 to 3. Accordingly, by narrowing a control width (a threshold voltage distribution width) by 0.1 V, a voltage difference between the upper limit of the threshold voltage distribution region and an upper foot verify voltage becomes wider, as compared with the case where the number of times of rewriting failure in the first time rewriting is from 0 to 3. Thereby, such a possibility is reduced that a threshold voltage exceeds an upper foot verify voltage.

When a number of rewrite failure times count value EWFC in the first time rewriting is from 8 to 15, it is determined that rewrite characteristics of a memory cell becomes further faster. For the case in which the rewrite failure in the first time rewriting occurs 4 to 7 times, the write start voltage is reduced by 0.1 V and 0.2 V and a control width is narrowed by 0.1 V to set to 0.4 V and 0.3 V to the respective cases where the number of times of rewriting is 1 to 1023 and where the number of times of rewriting is 1024 to 8191. The write verify voltage is set according to the number of times of rewriting.

When a number of times of rewriting is 8192 or greater, characteristics of a memory cell become still further faster and it is determined that the threshold voltage is highly likely to exceed the upper foot verify voltage even if a write start voltage is further reduced. Rewrite error process is performed.

When a number of rewrite failure time count value EWFC in the first time rewriting is 15 or greater, the write start voltage is yet further reduced by 0.1 V and a control width is set to 0.3 at the initial stage of rewriting, that is, when the number of times of rewriting is from 1 to 1023.

When the number of times of rewriting is 1024 or greater, it is determined that the threshold voltage is uncontrollable and an error process is performed.

Accordingly, by maintaining the number of times of rewrite as well as the number of times of failure in the first time rewriting in a historical record, to reflect both the data on write control, rewriting can be performed under a more optimized rewrite condition.

Note that in the table shown in FIG. 30, there is shown control on a write voltage. For an erase pulse, a way of control is contrary to that for the write pulse, and with increase of the number of rewrite failure times count value EWFC in the first time rewriting, a voltage level of an erase start pulse is raised.

Figure 31:
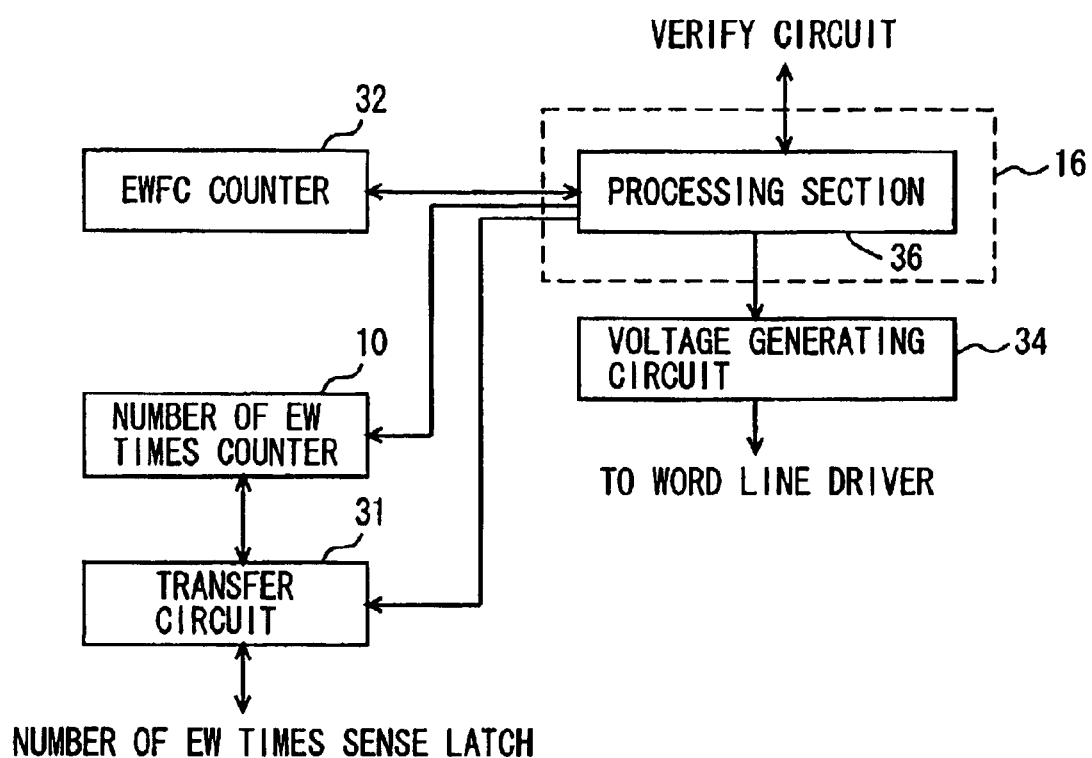
FIG. 31 is a diagram schematically showing a configuration of a main part of the non-volatile semiconductor memory device according to the fifth embodiment of the present invention.

FIG. 31 is a diagram schematically showing a configuration of a part related to the rewrite pulse. Controlling CPU 16 includes a processing section 36 performing various processes. Processing section 36 executes various controls according to a program loaded in advance.

Outside controlling CPU 16, there is provided an EWFC counter 32 having a count value is set according to a result of verification applied from a verify circuit under control of processing section 36. Processing section 36 increments a count value of EWFC counter 32 by one when the result of an upper foot verification from the verify circuit designates rewriting failure in the verify operation. Therefore, the number of times of rewriting failure in the first time rewriting is accumulated in EWFC counter 32.

Number of EW times counter 10 increments a count value thereof by one or a prescribed number under control of processing section 36. Number of EW times counter 10 transfers data bidirectionally with the number of EW times sense latch through a transfer circuit 31. Transfer circuit 31 transfers number of rewriting times data between number of EW times counter 10 and number of EW times sense latch under control of processing section 36.

A voltage applied to a word line driver is generated from a voltage generating section 34. Voltage generating section 34 generates a verify voltage (write and upper foot verify voltages), a write voltage, an erase voltage and a read voltage. The level of a voltage generated by voltage generating section 34 is controlled by processing section 36. That is, processing section 36, in a rewriting operation, sets a condition of the voltages necessary for rewriting according to counts (counts after update) of EWFC counter 32 and number of EW times counter 10. At this time, processing section 36, in rewriting, controls the update of number of EW times data transferred from the number of EW times sense latch section to number of EW times counter 10, and the transfer of updated data to number of EW times sense latch section.

When a pulse width is adjusted, an activation period of a word line driver is adjusted.

Alternatively, the pulse width may be adjusted in voltage generating section 34 to apply a pulse with the adjusted pulse width to a power supply node of the word line driver.

EWFC counter 32 and number of EW times counter 10 each can be constructed of an ordinary binary counter. Alternatively, EWFC counter 32 and number of EW times counter 10 each may be constituted of a register circuit having stored data be set by processing section 36.

Various kinds of operations are controlled by processing section 36 according to an applied command.

According to the fifth embodiment of the present invention, as described above, a rewrite condition is set in consideration of the number of times of rewriting failure in the first time rewriting, thereby enabling rewriting under a rewrite condition according to characteristics of a memory cell more correctly even if characteristics and others of the memory cell change.

Note that in the above description, when a rewrite command is applied, the number of times of rewriting is incremented by one. However, since when an erase command is applied, erasure and writing-back are performed, the number of times of rewriting is updated by one in a similar manner.

Segmentation of the regions of the number of times of rewriting for setting rewrite conditions is not limited to the divisions in the above embodiments, but may be replaced with another segmentation of the regions of the umber of times of rewritings.

As a construction of a non-volatile memory cell, the memory cell is not limited to a floating gate field effect transistor, but may be an insulating film trap type memory cell storing data by accumulating electric charges in an insulating film between a control gate and a semiconductor substrate region.

Moreover, a condition for only one of an erase pulse and a write pulse may be configured to be alterable according to the number of times of rewriting. Accordingly, a rewrite operation in the present invention indicates an operation of rewriting storage data, and covers a case where erasure and writing are both performed and a case where only erasure is performed. In each individual rewriting operation, erasure or writing is performed. Therefore, a rewrite pulse that is an object for changing a set condition therefor includes at least one of an erase pulse and a write pulse.

According to the present invention, as described above, a rewrite condition for a memory cell is set according to at least the number of times of rewriting of the memory cell, and data rewriting can be performed under a rewrite condition according to characteristics of a memory cell. Accordingly, the rewrite pulse can be prevented from being applied more than necessary, to achieve prevention of degradation of a tunnel insulating film of a memory cell and reduction in rewrite time.

Although the present invention has been described and illustrated in detail, it is clearly understood that the same is by way of limitation and example only and is not to be taken by way of limitation, the spirit and scope of the present invention being limited only by the terms of the appended claims.

What is claimed is:

1. A non-volatile semiconductor memory device comprising:
   a plurality of memory cells each for storing data in a non-volatile manner;
   a number of times of rewriting storage circuit for storing the number of times of rewriting of storage data of said plurality of memory cells; and
   a rewrite condition control circuit for setting a condition of a rewrite pulse including at least one of a write pulse for writing data and an erase pulse for erasing storage data in accordance with the number of times of rewriting indicated by storage data in said number of times of rewriting storage circuit in data rewriting of the memory cell, a condition for said at least one of said write pulse and said erase pulse in said rewrite pulse being alterable in accordance with the number of times of rewriting.

2. The non-volatile semiconductor memory device according to claim 1, wherein said rewrite pulse is applied plural times, and said rewrite condition control circuit sets a condition for a voltage change width between consecutive rewrite pulses in accordance with the number of times of rewriting indicated by data from said number of times of rewriting storage circuit, said voltage change width of said rewrite pulse being alterable in accordance with said number of times of rewriting.

3. The non-volatile semiconductor memory device according to claim 1, wherein said rewrite condition control circuit decreases the voltage change width of said write pulse with increase in the number of times of rewriting.

4. The non-volatile semiconductor memory device according to claim 1, wherein said rewrite condition control circuit increases the voltage change width of said erase pulse with increase in the number of times of rewriting.

5. The non-volatile semiconductor memory device according to claim 1, wherein said rewrite pulse is applied plural times, and said rewrite condition control circuit sets a condition on a pulse width change rate of consecutive rewrite pulses in accordance with the number of times of rewriting indicated by data from said number of rewriting times storage circuit, said pulse width change rate being alterable in accordance with the number of times of rewriting.

6. The non-volatile semiconductor memory device according to claim 1, wherein said rewrite condition control circuit decreases a pulse width change rate of said write pulse with increase in the number of times of rewriting.

7. The non-volatile semiconductor memory device according to claim 1, wherein said rewrite condition control circuit increases a pulse width change rate of said erase pulse with increase in the number of times of rewriting.

8. The non-volatile semiconductor memory device according to claim 1, wherein said rewrite pulse is applied plural times, and said rewrite condition control circuit sets a pulse width change rate and voltage change width of the rewrite pulse in accordance with the number of times of rewriting indicated by data from said number of rewriting times storage circuit, said pulse width change ratio and voltage change width being alterable in accordance with said number of times of rewriting.

9. The non-volatile semiconductor memory device according to claim 1, further comprising a rewriting repetition control circuit for determining, after rewriting of data in a selected memory cell, whether a threshold voltage of said selected memory cell falls within a prescribed voltage range, and when a threshold voltage range of said selected memory cell lies outside said prescribed voltage range, changing the number of times of rewriting to said selected memory cell by a prescribed value of at least 2 to repeat the rewriting of data in said selected memory cell.

10. The non-volatile semiconductor memory device according to claim 1, wherein said rewrite pulse is applied plural times, and said rewrite condition control circuit further sets a condition on at least of one of a voltage level and a width of a starting pulse applied first in a series of the rewrite pulse in accordance with said number of times of rewriting.

11. The non-volatile semiconductor memory device according to claim 1, further comprising a circuit for setting a condition on at least one of a width and position of a threshold voltage distribution of the plurality of memory cells in accordance with said number of times of rewriting, said at least one of said width and position of the threshold voltage distribution being alterable in accordance with said number of times of rewriting.

12. The non-volatile semiconductor memory device according to claim 1, further comprising a circuit for setting a level of a verify voltage applied for identifying whether rewriting of data in a selected memory cell is correctly performed in accordance with said number of times of rewriting, the level of said verify voltage being alterable in accordance with said number of times of rewriting.

13. The non-volatile semiconductor memory device according to claim 1, further comprising a circuit for setting a condition on a level of a read voltage applied for selecting a memory cell in accordance with said number of times of rewriting, the level of said read voltage being alterable in accordance with the number of times of rewriting.

14. The non-volatile semiconductor memory device according to claim 1, further comprising:

a rewriting repetition control circuit for determining, in data rewriting, whether rewriting of data of a selected memory cell is normally performed and repeating the rewriting of data of said selected memory cell in accordance with a result of determination; and a number of repetition times storage circuit for storing a number of times of repetition of rewriting performed according to said rewriting repetition control circuit, wherein said rewriting repetition control circuit sets a condition on said rewrite pulse in accordance with the number of times of repetition of rewriting stored by said number of repetition times storage circuit and said number of times of rewriting, the condition set to said rewrite pulse being alterable in accordance with the number of times of repetition of rewriting and said number of times of rewriting.

15. The non-volatile semiconductor memory device according to claim 1, wherein said number of repetition times storage circuit is placed in a common array with said plurality of memory cells.

16. A non-volatile semiconductor memory device comprising:

a plurality of memory cells each for storing data in a non-volatile manner;

a number of times of rewriting storage circuit for storing a number of times of rewriting of stored data in the plurality of memory cells; and a write condition control circuit for setting, in rewriting data of said memory cells, a condition on a write pulse for writing data in accordance with the number of times of rewriting indicated by stored data in said number of times of rewriting storage circuit, said condition on said write pulse being alterable in accordance with the number of times of rewriting.

17. A non-volatile semiconductor memory device comprising:

a plurality of memory cells each for storing data in a non-volatile manner;

a number of times of rewriting storage circuit for storing a number of times of rewriting of stored data of the plurality of memory cells; and an erase condition control circuit for setting, in rewriting data of the memory cells, a condition on an erase pulse for erasing stored data according to the number of times of rewriting indicated by stored data in said number of times of rewriting storage circuit, the condition on said erase pulse being alterable in accordance with the number of times of rewriting.

* * * * *